United States Patent [19]

Burnham et al.

[11] 4,317,085
[45] Feb. 23, 1982

[54] CHANNELED MESA LASER

[75] Inventors: Robert D. Burnham, Los Altos Hills; Donald R. Scifres, Los Altos; William Streifer, Palo Alto, all of Calif.

[73] Assignee: Xerox Corporation, Stamford, Conn.

[21] Appl. No.: 74,685

[22] Filed: Sep. 12, 1979

[51] Int. Cl.³ .............................................. H01S 3/19
[52] U.S. Cl. ........................................ 372/50; 357/17; 357/56
[58] Field of Search .................... 331/94.5 H; 357/17, 357/18, 56

[56] References Cited

U.S. PATENT DOCUMENTS

| | | | |
|---|---|---|---|
| 3,733,561 | 5/1973 | Hayashi | 331/94.5 H |
| 3,911,376 | 10/1975 | Thompson | 331/94.5 H |
| 4,033,796 | 7/1977 | Burnham et al. | 148/175 |
| 4,099,999 | 7/1978 | Burnham et al. | 148/187 |
| 4,166,253 | 8/1979 | Small et al. | 331/94.5 H |
| 4,215,319 | 7/1980 | Botez | 331/94.5 H |

FOREIGN PATENT DOCUMENTS 2716750 10/1977 Fed. Rep. of Germany ..... 331/94.5 H
2819843 9/1978 Fed. Rep. of Germany ..... 331/94.5 H
2348589 11/1977 France ........................ 331/94.5 H

OTHER PUBLICATIONS

Figueroa et al., "Curved Junction Stabilized Filament (CJSE) Double-Heterostructure Injection Laser", *App. Phys. Lett.* 321, Jan. 1, 1978, pp. 55-57.
Panish et al., "Reduction of Threshold Current Density in GaAs-$Al_xGa_{1-x}As$ Heterostructure Lasers by Separate Optical & Carrier Confinement", *App. Phys. Lett.* 22, No. 11, Jun. 1, 1973, pp. 590-591.

*Primary Examiner*—James W. Davie
*Attorney, Agent, or Firm*—W. Douglas Carothers, Jr.

[57] ABSTRACT

A heterostructure semiconductor laser is characterized by having a channeled mesa contiguous with the top surface of the laser substrate. The channeled mesa comprises an elongated mesa with an elongated channel formed in the top surface of the mesa structure. The epitaxial growth of semiconductor layers over the channeled mesa produces layers having uniform thickness with smooth facet like texture and without layer surface irregularities. The channeled mesa may also be employed in the fabrication of nonplanar large optical cavity lasers.

41 Claims, 30 Drawing Figures

CSP
LASER
(PRIOR ART)

←|·|→ W

CSP
LASER
(PRIOR ART)

FIG. 10

CHANNELED MESA LASER

BACKGROUND OF THE INVENTION

This invention relates to heterostructure injection lasers and improvements relating to their structure, operation and yield.

One of the most successful semiconductor lasers to date are the channel substrate lasers which may be planar, such as, disclosed in U.S. Pat. No. 4,099,999 or may be nonplanar, such as, disclosed in U.S. Pat. No. 4,033,796. The channel substrate planar (CSP) laser has recently enjoyed some commercial success, offering stable single transverse and longitudinal mode operation. However, the fabrication of these lasers has not been easily iterative causing very low yields from a single wafer and, as a consequence, high production costs and high pricing in the market place.

The major problem in reproduction of the CSP laser is two fold. First, it is difficult to closely control the thickness of the initially grown layer on the substrate of the device so that the layer is of uniform thickness in the layer region on adjacent sides of the substrate channel. For optimal design, these regions should be thin in thickness, such as, 0.2–0.5 $\mu$m. Such thicknesses are difficult to obtain and systematically reproduce, particularly in liquid phase epitaxy processing. These thicknesses may be exceeded while growth of the initial layer on the substrate is progressing in epitaxially filling the substrate channel to the desired dimension.

Secondly, it is difficult to obtain uniform growth of the initial layer because in the process of epitaxially filling the substrate channel with the initial layer, the growth rate on either side of the channel is usually different from one another. The principal reason for this difference in growth rates is that most substrate wafers are off in crystal orientation. As a result, layer thickness variations and layer interface ripples and irregularities occur during crystal growth. These irregularities effect the efficient operation of the laser by causing light scattering, increasing current thresholds, and producing off axial, far field beam patterns due to tilted optical phase fronts.

Another problem with conventional CSP lasers is that the emitting aperture of the laser tends to be asymmetric. For beam focusing applications, this may represent a cost disadvantage, as a cylindrical lens will be required for effective focusing. Such lenses are much more expensive than spherical lenses. Spherical lenses could be employed if the beam is substantially symmetrical.

SUMMARY OF THE INVENTION

According to the present invention, a heterostructure semiconductor laser is provided with a channeled mesa contiguious with the top surface of the substrate water comprising an elongated mesa with an elongated channel formed in the top surface of the mesa whereby during crystal growth of the semiconductor layers on the substrate, the channel on top of the mesa fills in very quickly. This provides for the remaining layers to grow above the mesa with uniform thickness and with smooth facet type finishes and without layer surface irregularities. The channeled mesa structure permits iterative and accurate controls of layer thicknesses above the mesa without layer surface irregularities. During growth, the channel in the mesa as well as the outer sides and edges of the channeled mesa epitaxially fill with source material prior to any significant deposition of these materials on the top surface of the channeled mesa. This permits accurate control of the uniformity of layer thicknesses.

Furthermore, the increased expitaxial growth rate in the channel of the mesa and along the outer mesa walls produces a rapid extending epitaxial delivery in opposite directions away from the elongated mesa structure. This lateral growth action causes the layers over the channeled mesa to be very smooth with a facet type texture. Surface irregularities do not form in the layers above the channeled mesa even if the substrate wafer orientation is slightly incorrect. This is achieved because the mesa is narrow enough to allow for quick adjustment during growth to ensure a very smooth fact type texture.

Laser structures incorporating the channeled mesa geometry increase reproducibility and yield of these heterostructure lasers reducing or, otherwise, eliminating layer interface irregularities and producing uniform thickness layers having a facet like texture. As a result, operating current thresholds are lower and optical efficiency is enhanced with improved far field beam pattern and reduced optical scattering during light wave propagation.

To improve the symmetry of the emitting aperture, the laser heterostructure may be provided with a nonplanar large optical cavity (NP-LOC) While carrier confinement is maintained at the boundaries of the active layer, one or more additional layers may be provided in the laser structure to provide a large optical cavity so that the emitting aperture is more symmetric. This is achieved by growing a nonplanar geometry in the region of light wave propagation. Such layer geometry is provided by a channel in the substrate or a channeled mesa contiguous with the substrate prior to semiconductor layer growth.

Since the propagating light in the laser device can expand into a wider, nonplanar waveguide, the emitting aperture of the device will be more symmetric than conventional CSP lasers. Also, lowest order mode control is obtained with the NP-LOC structure without reliance on absorbtion losses laterally into the substrate in proximity to the established optical cavity of the laser.

Other objects and attainments together with a fuller understanding of the invention will become apparent and appreciated by referring to the following description and claims taken in conjunction with the accompanying drawings.

BRIEF DESCRIPTION OF THE DRAWINGS

FIG. 10 is a side elevation of a channel mesa laser having yet another modified mesa geometry.

DESCRIPTION OF THE PREFERRED EMBODIMENTS

Introduction

Because of the number of structures to be discussed, numeral references to the drawings will be minimized by employing the same numeral for like components or elements in different structures. A different numeral is employed where compositional or geometrical changes are made to such a component or element. Structural components, once numerically identified and described, will not be again described unless there is an intended modification thereto.

Fabrication by conventional LPE processes is illustrated in the disclosed structures. However, fabrication is not limited to this type of epitaxial procedure. Vapor phase epitaxy (VPE), such as, molecular beam epitaxy (MBE) or metalorganic chemical vapor deposition (MOCVD), may be employed. Employing MBE or MOCVD processes would produce substantially the same structures except that the layers would be more uniformly contoured to the configuration of the substrate surface with sharper bends and corners in the contigously deposited layers rather than gradual curves and bends characteristic in LPE growths.

Different alloy compositional materials and systems may be employed. For example, InP substrates may be employed, which are lattice matched materials for certain compositions and InGaAsP deposited layers. Other light emitting materials that may be employed are GaAlAsP, InAlGaAsP, PbSnTe and a host of II-VI compounds.

Also, the conductivity type of the layers of the structures to be described may be reversed, as is well known in the art.

Further, different conventionally known current confinement schemes may be employed above and/or below the active layer of the laser. Such schemes include ion implantation, diffusion, substrate stripes, mesa stripes, internal stripes, resistive stripes, laser annealed stripes, insulating stripes, and transverse junction stripes.

PRIOR ART STRUCTURES

Figure 1:
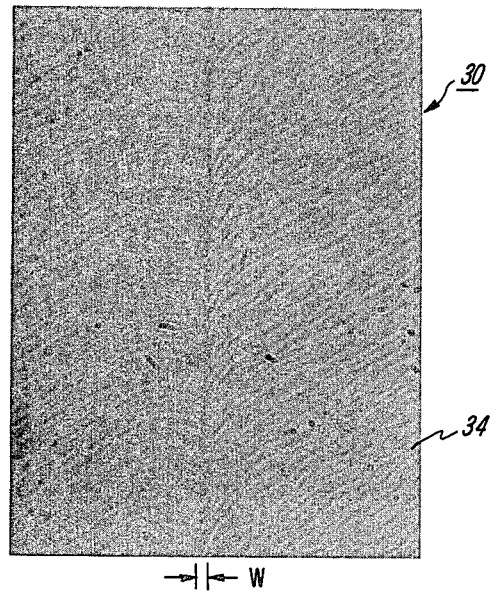
FIG. 1 is an optical photograph of the top surface of the prior art channel substrate planar (CSP) laser with crystal growth terminated upon deposition of the active layer.
Figure 2:
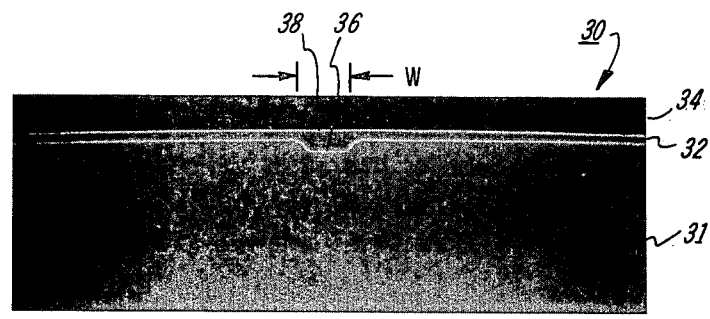
FIG. 2 is a scanning electron microscope photomicrograph of a cross-sectional view of the laser shown in FIG. 1.

In FIGS. 1 and 2, a portion of a CSP heterostructure laser 30 is pictorially shown. The portion shown consists of a substrate 31, first confining layer 32 and an active layer 34. The area shown above the active layer 34 is free space with a dark background, so that the surface of layer 34 is exposed.

An elongated channel 36 is disposed in the substrate 31. The width, w, of this channel may be on the order of 7 $\mu$m.

Laser 30 is constructed so that current confinement is achieved via channel 36 because of the fabrication of a reverse biased p-n junction between the outer interface regions of substrate 31 and layer 32. The path of the pumping current is confined through the small portion 38 of layer 34, which may be about 10 to 20 $\mu$m wide.

Substrate 31 may be n-GaAs, layer 32 may be n-Ga$_{0.65}$Al$_{0.35}$As and the active layer 34 may be p-Ga$_{0.95}$Al$_{0.05}$As. The method of fabrication of laser 30 is disclosed in U.S. Pat. No. 4,099,999.

To be noted in FIG. 1 is the multitude of face ripples and irregularities that appear over and about the channel 36. These irregularities are caused during the LPE growth process. They appear to occur because of different growth rates established on adjacent sides of the channel 36. The presence of the channel and the "filling-in" growth of this channel contribute to the differences in growth rate. Also the substrate wafer may be very slightly off crystal orientation contributing to these different growth rates resulting in layer thickness variations and layer interface and surface ripples and other such irregularities.

These defects are one of the reasons contributing to the low commercial yield of these structures, which presently is less than 10%.

CHANNELED MESA STRUCTURES

Figure 3:
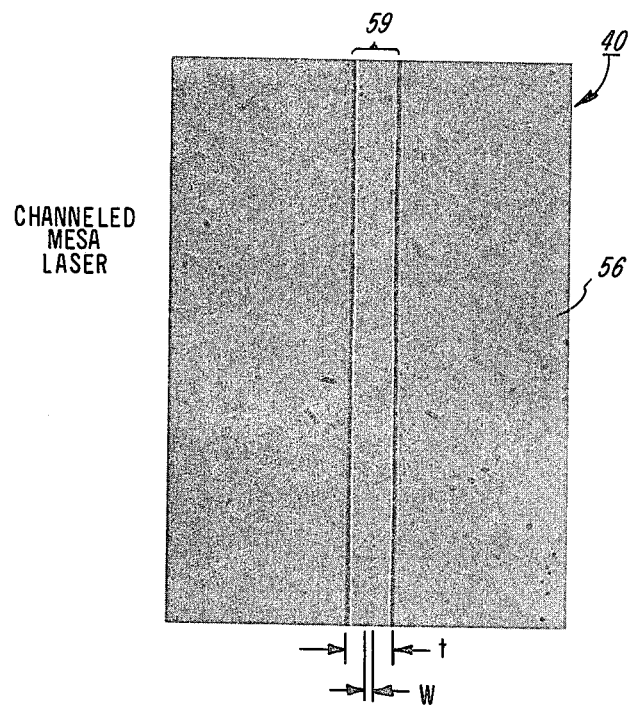
FIG. 3 is an optical photograph of the top surface of the channeled mesa laser of this invention with crystal growth terminated upon deposition of the active layer.
Figure 4:
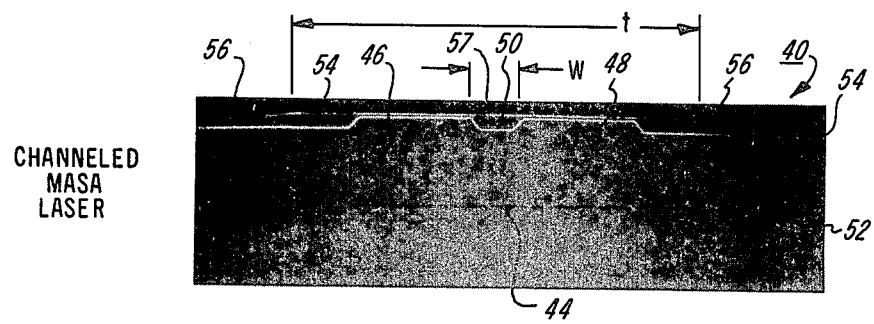
FIG. 4 is a scanning electron microscope photomicrograph of a cross-sectional view of the laser shown in FIG. 3.

In FIGS. 3 and 4, a portion of a laser 40 of this invention is pictorially shown. The portion shown consists of a substrate 52, a first confining layer 54 and an active layer 56. As in the case of FIG. 2, the area above layer 56 is free space with a dark background so that the surface of layer 56 is exposed.

A channeled mesa 44 is contiguous with the substrate 52, i.e., the mesa may be fabricated on or in the substrate 52. The channeled mesa 44 comprises an intermediate channel 50 defining two submesas 46 and 48. For the example shown, mesa 44 has a mesa width of about 25 $\mu m$ with the width, W, of channel 50 about 5 $\mu m$ wide, leaving the width of each of the submesas 46 and 48 at about 10 $\mu m$.

With LPE growth of layers 54 and 56 over mesa 44, a very flat, smooth faceted plateau region 59 is formed across the mesa. The width, t, of this plateau is about 50 $\mu m$.

To be noted in FIG. 3 is that there are no significant ripples or irregularities in the plateau region 59. The surface of this mesa region shows the active layer in region 57 to be substantially free of any surface irregularities. The comparative region in the prior art structure (FIG. 1) is plagued with surface irregularties from the center axis of the channel 36. These irregularities scatter light, disorient the emitting aperture and reduce overall optical efficiency and mode stability of the optical waveguide cavity of the CSP laser 30.

The channeled mesa 44 improves the optical efficiency by permitting the accurate control and growth of uniform layers over the mesa forming facet like surfaces. Irregularities do not appear in region 59 over the mesa 44 but rather appear in regions adjacent to this region outside the optical waveguide cavity, as shown in FIG. 3.

Mention should be made that within the confines of region 59 in FIG. 3, there appear some uniformly disposed semicircular ripples in the structure 59. These ripples, as compared to the irregularities in the same region in the CSP laser of FIG. 1, are not sufficiently pronounced to cause a large deleterious scattering effect. We have since fabricated channeled mesa structures showing no ripples of this or of any other kind in the plateau region 59. The purpose of FIGS. 3 and 4 is to demonstrate, on a comparative basis, the significant improvement achieved in reduction of surface irregularities in semiconductor layers during the growth process employing the channel mesa 44 of this invention.

As an ancillary clarification, the dark specks in FIGS. 1 and 3 are not surface irregularities but rather are dust and dirt particles on the inner lens of the high power optical microscope used in taking these photographs.

It is to be further noted that the channeled mesa 44 could also be described as two elongated parallel mesas 46 and 48 sufficiently close to define the channel 50 therebetween. However, because of the variety of mesa geometries that may be modified from this basic design, it is more practical to refer to the overall structure as a mesa 44 with a channel 50 within, thereby defining two submesas 46 and 48 having inner facing side walls and outwardly facing opposed walls. The double mesa concept, therefore, would be considered synonymous to the described channeled mesa 44.

Figure 5:
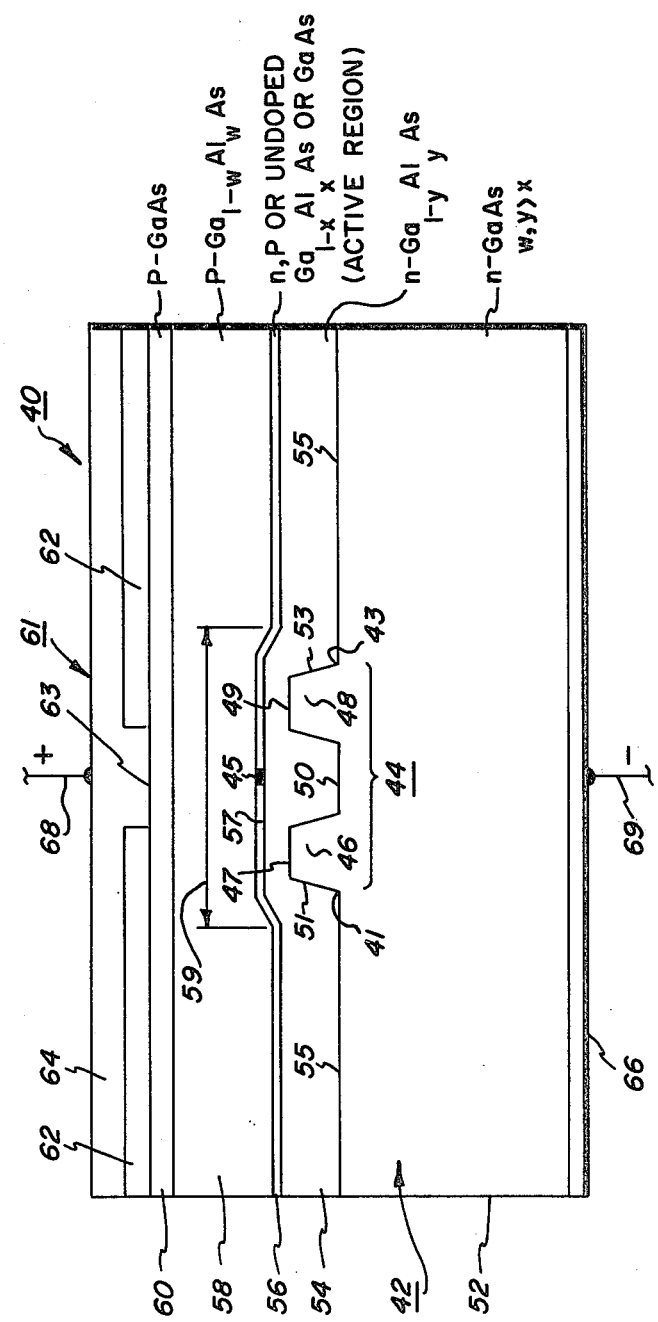
FIG. 5 is a side elevation of a channeled mesa laser comprising this invention.

The phenomena of producing an active region and an optical waveguide cavity free of surface ripples and irregularities employing the channeled mesa 44 of this invention has not been completely clarified physically and theoretically, but is believed that a contribution to this phenomena is the presence of the side channels 51 and 53 and edges 41 and 43 (FIG. 5). During epitaxial growth of layers 54, 56, etc., the semiconductor source material, being supplied as a fuel for layer growth has a tendency to initially fill in the inside edges 41 and 43, that is, the source material will deposit mostly in channel 50 and edges 41 and 43. The movement of material about the submesas 46 and 48 to accomplish this "first fill-in" process tends to greatly limit the deposit of fuel on the plateau surfaces 47 and 49 of the submesas. The narrowness of the submesas 46 and 48 allows the source material to readily diffuse toward areas of favored nucleation, that is, channel 50 and edges 41 and 43. The deposited material tends to "push away" from the edges 41 and 43 and the side walls 51 and 53, this growth being many times greater than the rate of the growth on the submesa surfaces. After growth has filled in channel 50, a smooth facet growing action is established transversely across the channeled mesa 44. Also the thicknesses of layers over the mesa structure can be accurately and uniformly controlled. Absence of any substantial growth on the submesa surfaces 47 and 49 is obtained while establishing a featureless faceted effect for material deposited over the mesa structure 44.

This effect continues as additional layers are grown and as the growth extends laterally away from the edges 41 and 43 and away from the submesas outer side walls 51 and 53. This facet effect results in a smooth mesa plateau 59 substantially free from surface defects and irregularities. Such surface irregularities appear in regions beyond the plateau 59 which have no deleterious effect on the operation of the laser since they are remote to the laser optical cavity.

It is estimated that for heterostructure lasers fabricated with the channeled mesa structure of this invention, with proper and efficient heat sink mounting, minimum yields in production may be 40% or more. This is due to the accurate and systematic reproducibility of these structures and the substantial reduction in optical defects and irregularities during fabrication.

FIG. 5 shows the total laser structure for the laser 40 including the channeled mesa 44. FIGS. 6 through 18 represent variations in the fabrication and geometry of this basic structure but all these lasers employ a channeled mesa 44.

Laser 40 comprises substrate 52 of n-GaAs having channeled mesa 44 and upon which are consecutively deposited a confining layer 54 of n-Ga$_{1-y}$Al$_y$As, an active layer 56 of n, p or undoped Ga$_{1-x}$Al$_x$As or GaAs, a confining layer 58 of p-Ga$_{1-w}$Al$_w$As and a capping layer 60 of p-GaAs. During fabrication, a mesa plateau region 59 is established having the facet like surface quality, as previously explained.

Insulating layer 62 is deposited on capping layer 60 and may comprise $Si_3N_4$, $SiO_2$, $Al_2O_3$ or any other conventional insulating layer. Current confinement means 61 is a stripe contact and 63 is formed by preferentially etching an elongated exposed area through the insulating layer 62 to the layer 60 and directly over the channeled mesa 44. A metalization 64 is then deposited on the surface of the structure. The metalization may be integral layers of Ti, Pt and Au or integral layers of Cr and Au or Au and Ge.

Metalization 66 is deposited on the bottom surface of sustrate 52 and may be comprised of integral layers of Sn, Pd and Au or Au and Ge. The metalized layers 68 and 69 provide for electrical connection and operation of laser 40. Pumping current is supplied via terminals 68 and 69 to the proper threshold to cause lasing conditions to be established in active region 57 with light in the infrared range emitted from aperture 45. The end surface 42 is one of the two opposed cleaved facets that provides optical feedback necessary to establish lasing conditions.

The range of mole fractions for the layers 54, 56 and 58 are shown in Table I.

TABLE I

| layer | mole fraction range | specific example | layer thickness ($\mu$m) |
|---|---|---|---|
| W | .2–.7 | .35 | 1 |
| X | 0–.3 | .05 | .1 |
| Y | .2–.7 | .35* | .3 (above submesas 46,48) |

*may be slightly less than W, such as, .30 to .35

A specific example of the fabrication of laser 40 is as follows. Fabrication of laser 40 requires a single LPE process at about 700° C. using a 0.4° C./min cooling rate. Photolithographically delineated channel 50 and substrate surface regions 55 are preferentially etched along the (01$\bar{1}$) direction into a n-type Si-doped $(2 \times 10^{18}$ cm$^{-3})$, (100)-oriented GaAs substrate 52 using a mixture of 120 ml ethylene glycol, 6.5 ml $H_3PO_4$, 30 ml $H_2O_2$ and 1 ml HF. The channel depth may be approximately 0.5 to 1.5 $\mu$m and 5 $\mu$m wide. The regions 55 may also be etched to a depth of 0.5 to 1.5 $\mu$m.

The first layer 54 of growth by LPE is n-$Ga_{0.65}Al_{0.35}As$ $(5 \times 10^{17}$ cm$^{-3})$. This layer growth is continued until channel 50 is completely filled in and flattens the growth thereby establishing a plateau region 59. The thickness of the layer 54 above the surfaces 47 and 49 is approximately 0.3 $\mu$m. The active layer 56 is next deposited and is p-$Ga_{0.95}Al_{0.05}As$ $(3 \times 10^{17}$ cm$^{-3})$. This is followed by the deposition of layer 56 of p-$Ga_{0.65}Al_{0.35}As$ $(5 \times 10^{17}$ cm$^{-3})$ and layer 60 of p-GaAs (about $5 \times 10^{17}$ cm$^{-3}$).

On the surface of layer 60, an 8 $\mu$m wide stripe contact 63 is aligned directly above the channel 50. Ohmic Cr/Au p-type and Sn/Pd/An n-type contacts 64 and 66, respectively, are then applied.

Figure 6:
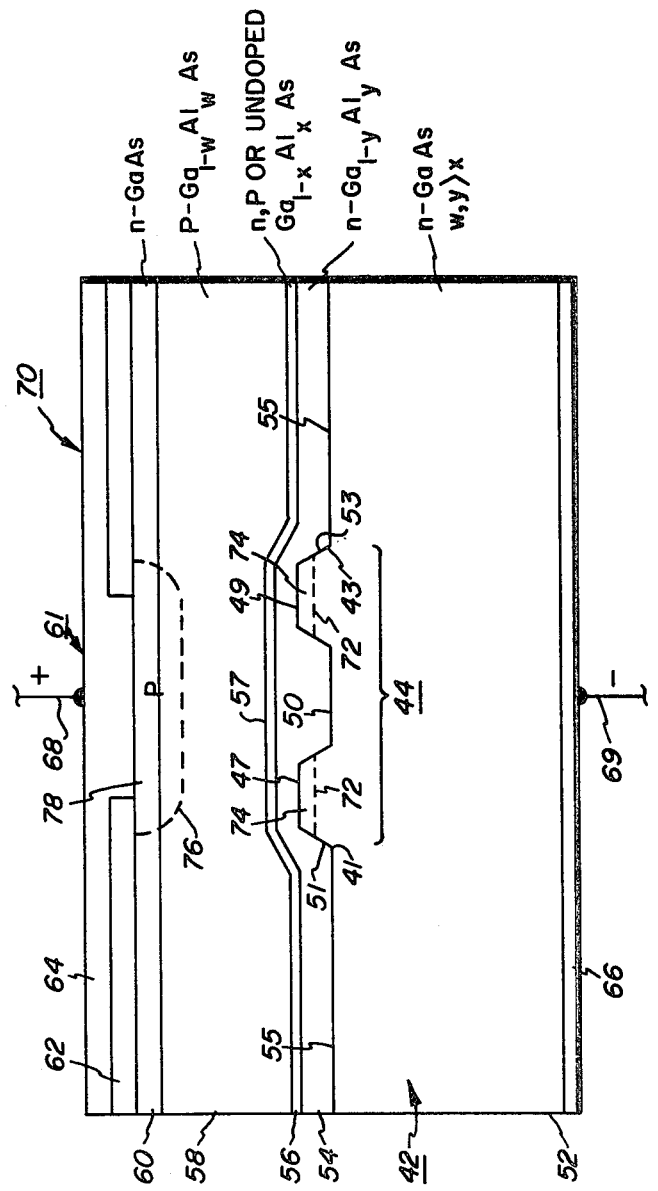
FIG. 6 is a side elevation of a channeled mesa laser having different mesa dimensional geometry compared to FIG. 5.

In FIG. 6, laser 70 is the same as laser 40, except for geometry differences in mesa 44 and added current confinement. Prior to the preferential etching of the surface of the substrate 52, a zinc diffusion 72 is performed in the surface creating p-type regions 74. This establishes a reversed biased p-n junction at the interface between the surfaces 47 and 49 of the submesas and layer 54 aiding in the confinement of current to a path through the n-type channel 50.

Also the capping layer 60 is n-type GaAs rather p-type. A zinc diffusion 76 is performed through this layer and into the layer 58. The diffused region 78 provides a current confinement path directly over the active region 57. After the zinc diffusion 76 is performed, the insulating layer 62 can be removed, if desired, since a reversed bias junction is present at the interface between layers 58 and 60 beyond the diffused region 78.

Laser 70 is also provided with a wider channel 50. The submesas 46 and 48 are of lower height with wider plateau surfaces 57 and 49 than those of laser 40.

Fabrication of these structures thus far has shown that it is preferable to have a fairly narrow width channel 50 and a high peak to valley ratio with narrow submesa plateau surfaces 47 and 49. For example, the channel depths may vary from 0.5 to 4 $\mu$m and the width of the individual surfaces 47 and 49 may be 0 to 5 or 10 times the width, W, of the channel 50 (W represents the average width of channel 50). The preferred ratio range of submesas to channel width is about 2:1 to 5:1. The criteria to be established is that the surface extent of the submesas 47 and 49 should not be too small as to cause meltback of these structures during growth. Their surface extent should not be too large as to render the facet forming effect inconsequential thereby developing the irregular characteristics of the CSP laser. For optimum design, the channel width to submesa plateau width ratio is established to provide the minimum amount of deposit or growth on the submesa surfaces 47 and 49 while filling in the channel 50 and edges 41 and 43 without developing any meltback. As a result, control over the uniformity of the layers above the mesa 44 can be established together with facet like surfaces and featureless layer interfaces. Additional measures can be taken to help minimize meltback, such as, supersaturating the melt, growing at lower temperatures (700° C.) and having a fairly high cooling rate (0.4° C./minute).

Examples of channel width to submesa width parameters immediately mentioned above are illustrated in FIGS. 7 through 10.

Figure 7:
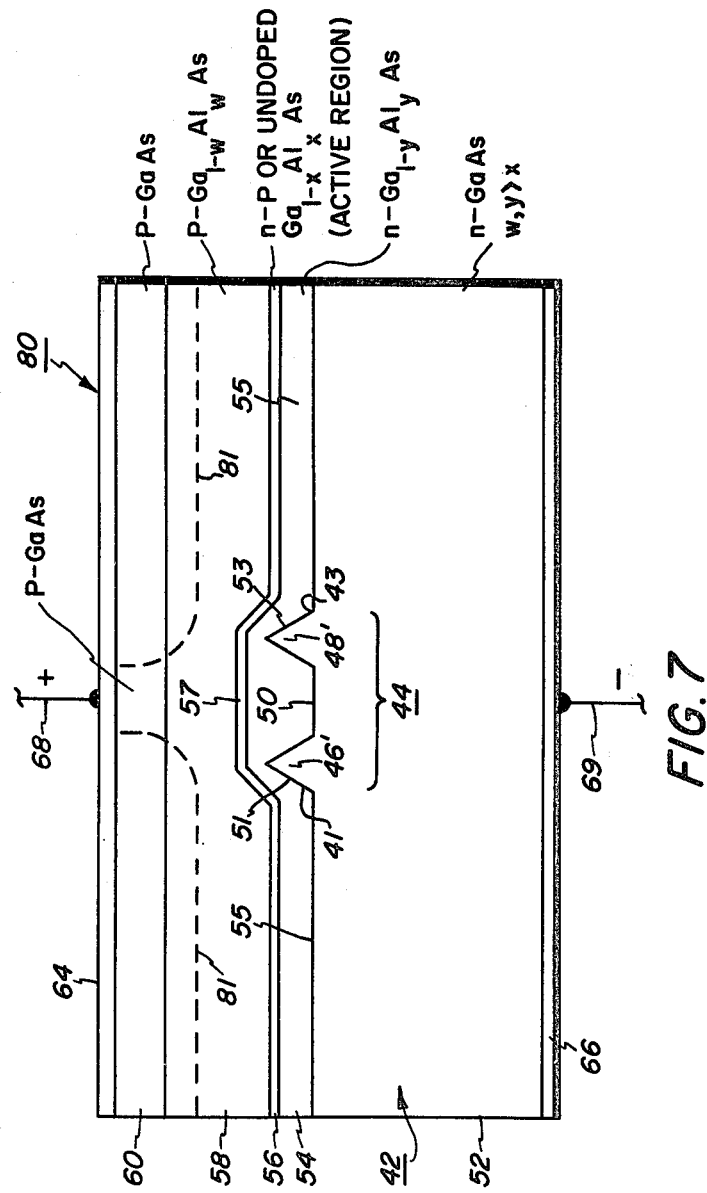
FIG. 7 is a side elevation of a channeled mesa laser having modified mesa geometry.

In FIG. 7, the channeled mesa 44 comprises triangular shaped submesas 46' and 48', so that their plateau surfaces are merely a line or are substantially of zero width. Current confinement to an area above the active region 57 is provided by means of a high resistive or semi-insulating proton or ion implant, as represented by the dotted lines 81.

Figure 8:
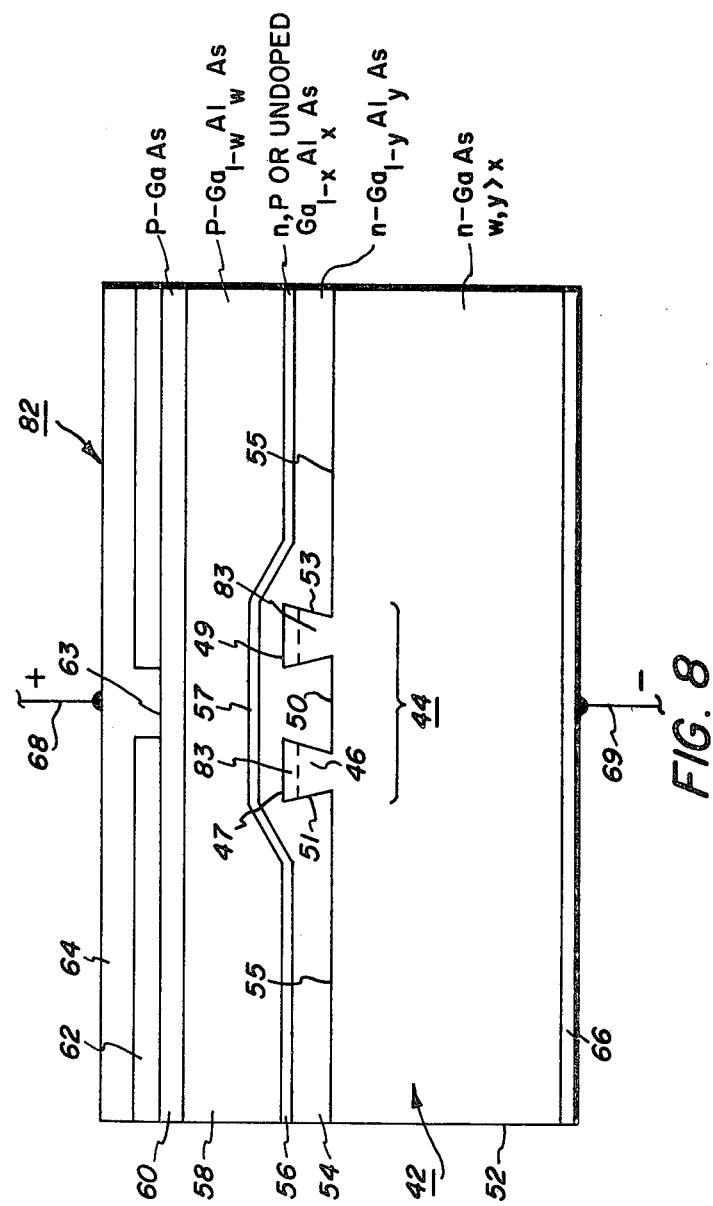
FIG. 8 is a side elevation of a channeled mesa laser having a further modified mesa geometry.

In FIG. 8, the channeled mesa 44 of laser 82 is provided with submesas 46 and 48 with a contour representative of a dove tail. Also, the diffusion regions 83 are formed in the surface of the substrate 52 prior to preferential etching the channeled mesa structure. The etchant employed is of the type that will undercut the mask applied prior to performing the preferential etching step or by etching the submesas 46 and 48 along the (01$\bar{1}$) direction.

Figure 9:
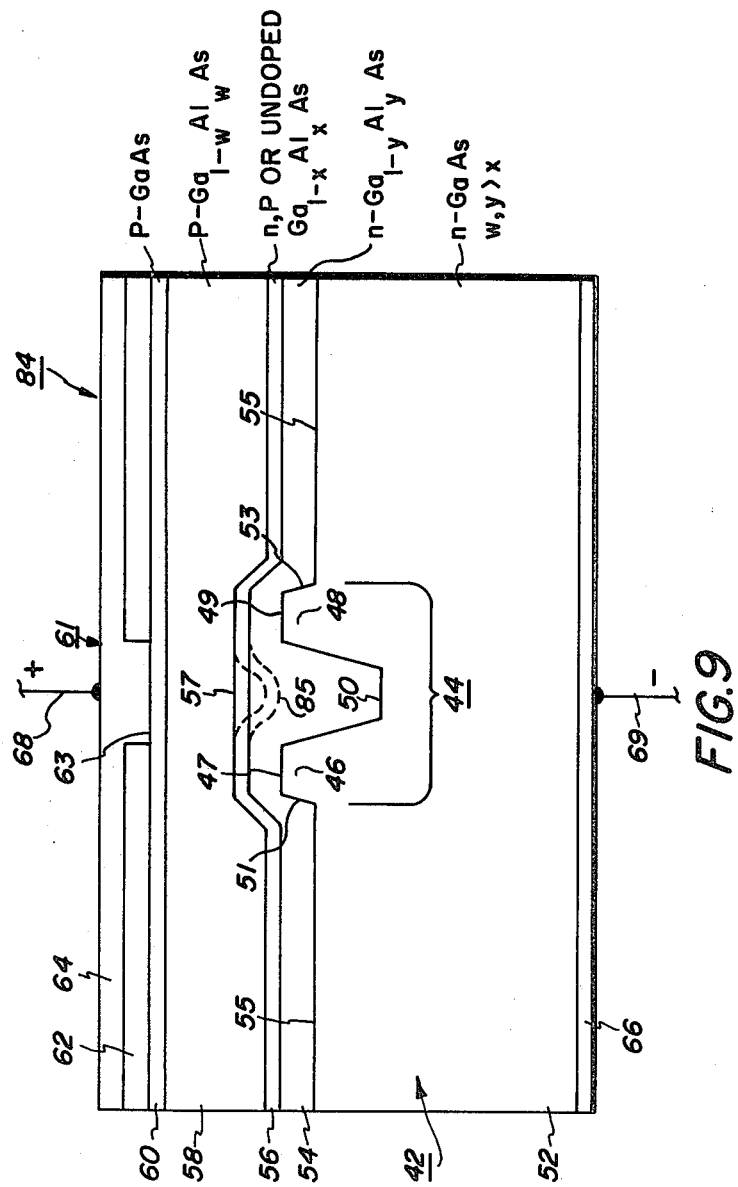
FIG. 9 is a side elevation of a channeled mesa laser having another modified mesa geometry.

The laser 84 of FIG. 9 is provided with a deeper etched channel 50 compared to etched regions 55 of substrate 52. This channeled mesa structure is very suitable where a nonplanar active layer is desired as shown by dotted lines 85. The formation of a nonplanar structure 85 is accomplished by terminating growth of layers 54 and 56 prior to channel fill-in. Also, the substrate diffusion of FIG. 27 would be highly suitable for laser 84 to provide optimum current confinement below the active region 57 through the channel 50.

Figure 10:
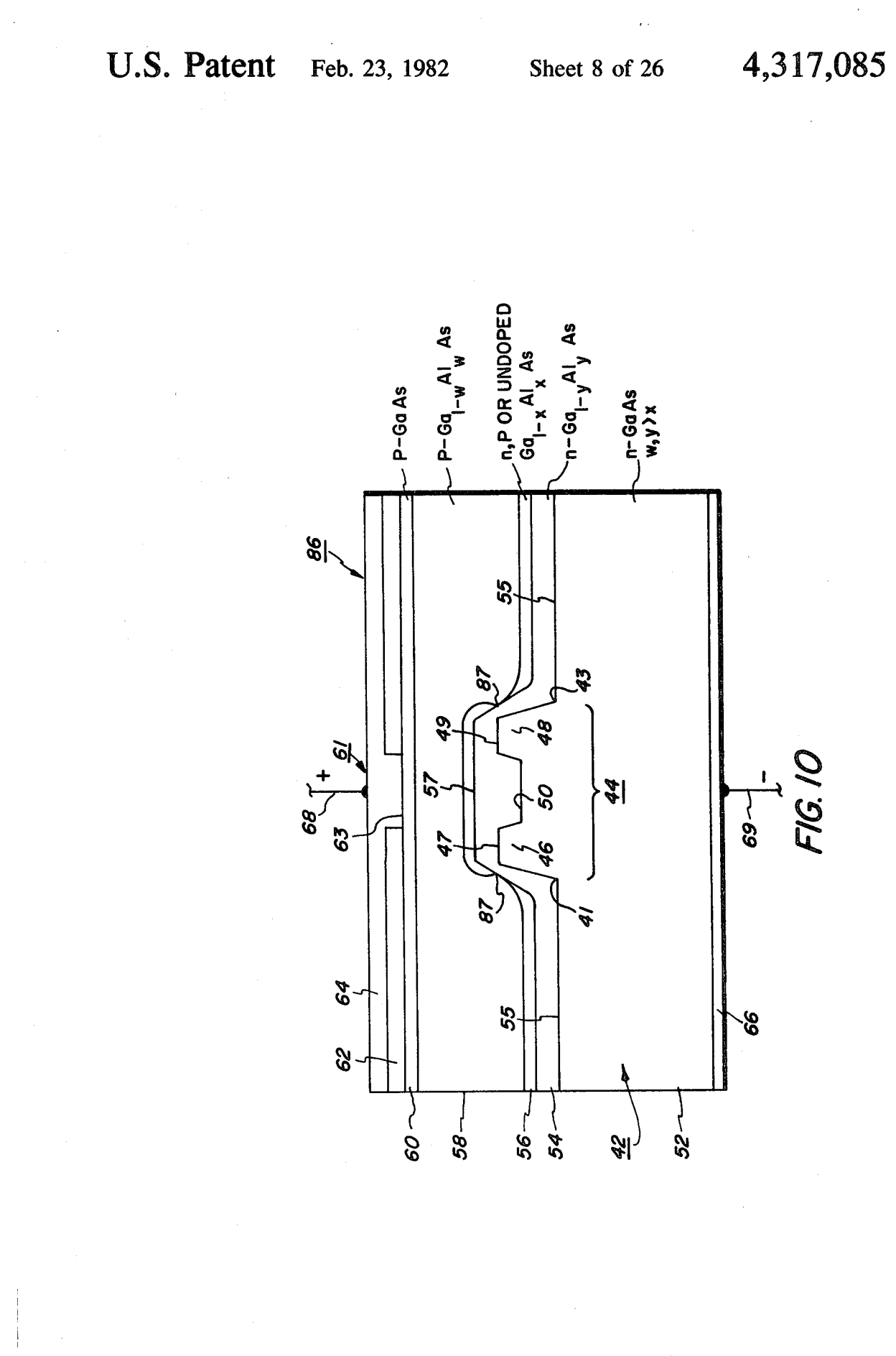

The channeled mesa structure shown in FIG. 10 for laser 86 represents the antithesis of the channeled mesa structure shown in FIG. 9. Channel 50 is preferentially etched to a shallower depth than regions 55 of substrate 52. This channeled mesa structure is very suitable for establishing pinched off points 87 during the growth, these points defining the lateral limits of the active region 57. This same channeled mesa structure may be used to establish the pinch off points 91 or 92 shown in FIG. 12.

Figure 11:
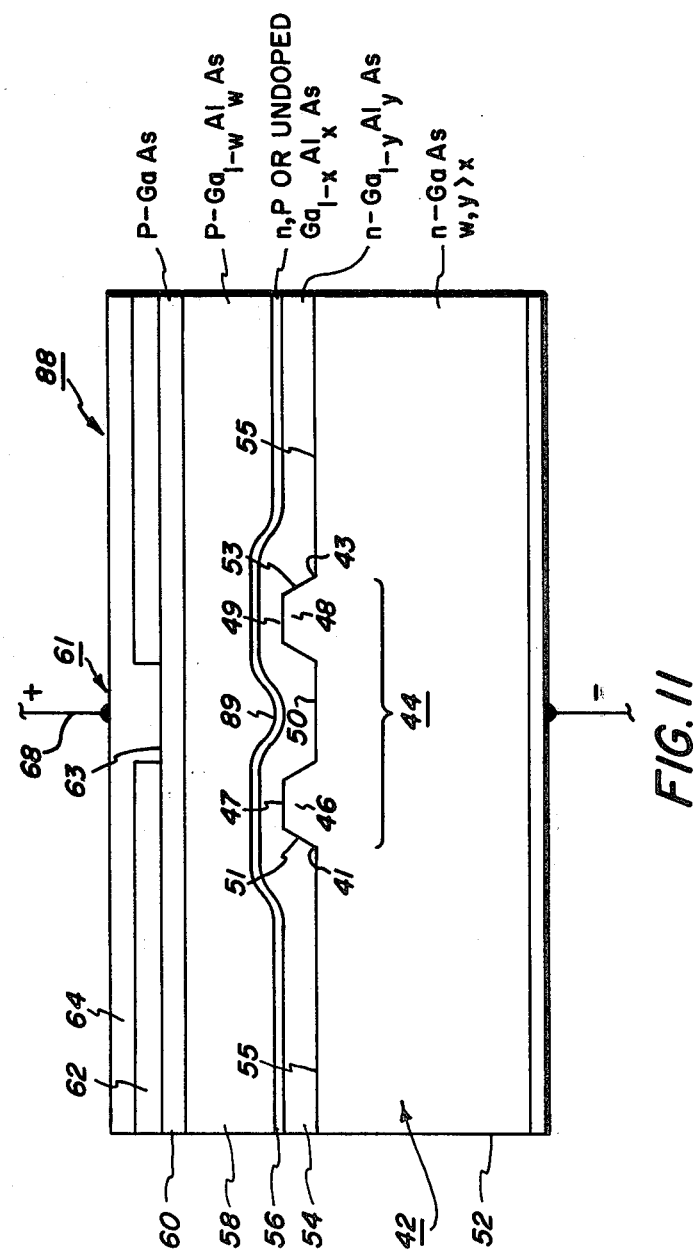
FIG. 11 is a side elevation of a channeled mesa laser similar to FIG. 5 with crystal growth controlled to produce a nonplanar structure.

In FIG. 11, laser 88 is provided with a non-planar active layer 56. The nonplanar portion 89 is established by terminating the growth of layer 54 prior to complete epitaxial leveling of the surface of this layer and commencing the growth of the active layer 56. The contour and functioning nature of the active region 57 of the laser 88 is the same as the active region of the laser device disclosed in U.S. Pat. No. 4,033,796.

Figure 12:
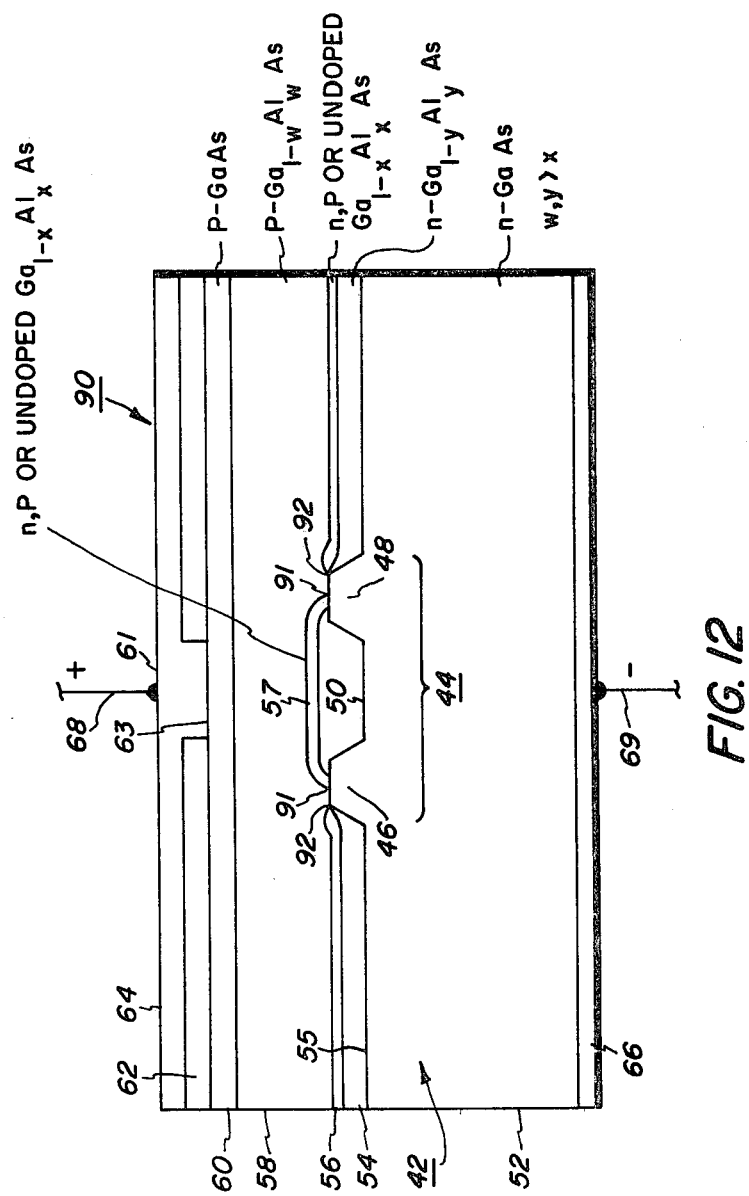
FIG. 12 is a side elevation of a channeled mesa laser with crystal growth controlled to produce a pinched off active region in the active layer thereof.

In laser 90 of FIG. 12, the growth of layer 54 is terminated prior to any significant growth above the submesa surfaces 47 and 49.

As previously indicated, the narrowness of the submesas 46 and 48 allows the source material to readily diffuse toward areas of favored nucleation, such as, channel 50 and edges 41 and 43. Because of this diffusion phenomena, very little or no growth occurs on the submesa surfaces 47 and 49 until the favorability of these nucleation sites is somewhat reduced, at which time growth on and over the submesas will accelerate. The subsequent growth of the $Ga_{1-x}Al_xAs$ active layer 56 can be controlled to pinch off points 91 and 92, the points 91 defining the limits of the active regions 57.

Figure 13:
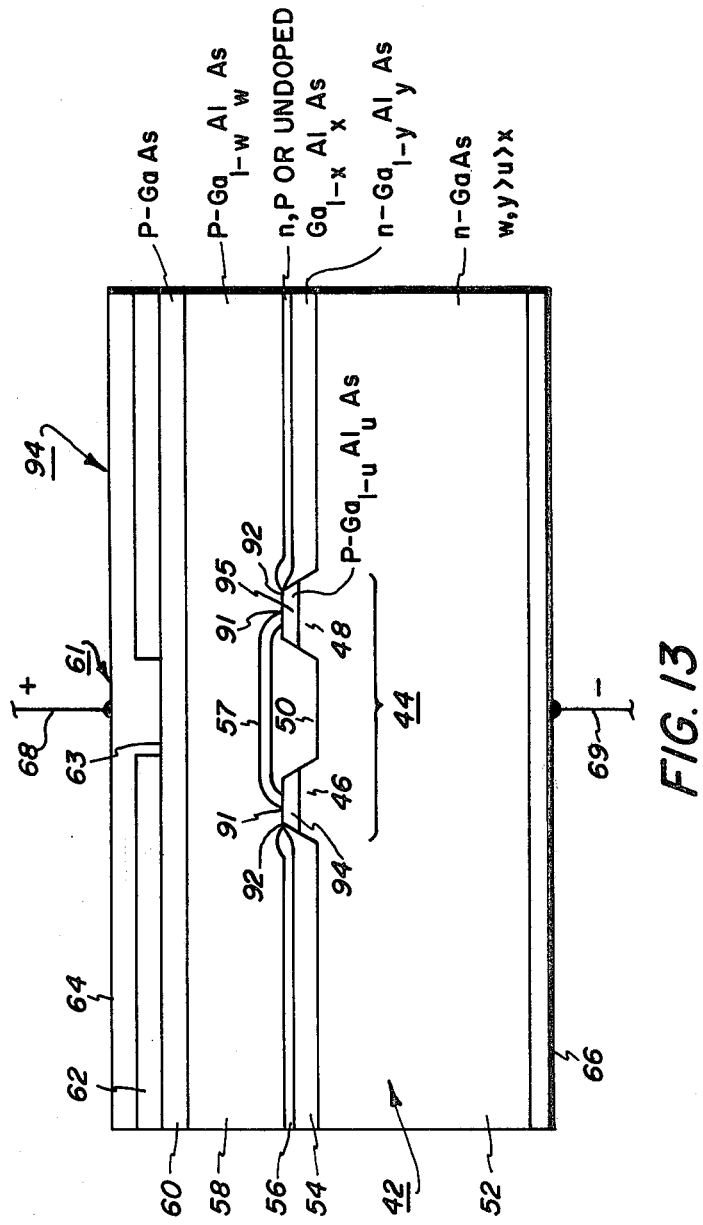
FIG. 13 is a side elevation of a channeled mesa laser similar to that shown in FIG. 12 with a modification made to the mesa structure.

The structure of laser 94 of FIG. 13 is similar to that of laser 90 in FIG. 12 but, in addition, is provided with top layers 94 and 95, respectively, on the submesas 46 and 48 comprising $P-Ga_{1-u}Al_uAs$ where, $w,y > u > x$. Layers 94 and 95 are formed by initially depositing on the substrate 52, a layer of $p-Ga_{1-u}Al_uAs$, followed by preferential etching to form channel 50 and etched regions 55. Layers 94 and 95 are required to have very low concentrations of Al, such as, within the range of 0–0.2 (0.05 as a specific example). These low Al layers inhibit growth on their upper surfaces, which is characteristic for growth involving buried heterostructures.

It is conceivable that these layers 94 and 95 be employed to establish very thin overlayers of layer 54 just above the submesa surfaces, such as, 0.05 μm thick. This may be accomplished by continuing the growth of layer 54.

The surface layers 94 and 95 may be made semi-insulating to provide current confinement properties.

Figure 14:
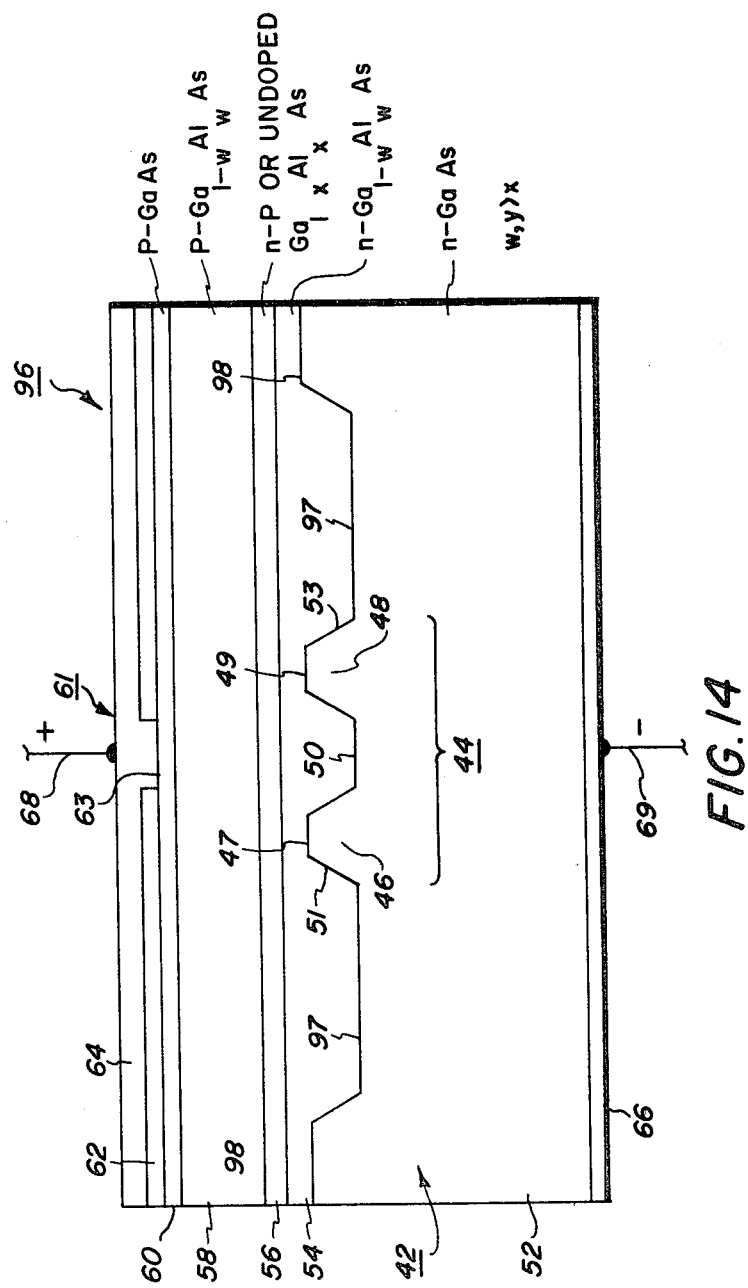
FIG. 14 is a side elevation of a channeled mesa laser similar to that shown in FIG. 5 but provided with additional substrate surface modifications.

Laser 96 in FIG. 14 is very similar in structure to laser 40 in FIG. 5 except for a modification to the configuration of the surface of the substrate 52. The channeled mesa 44 of the laser 96 is provided with regions 55 formed as channels 97 extending from between the submesa sides 51 and 53 to the raised regions 98 of the substrate surface. The channels 97 are extensively wider than channel 50. For example, channeled mesa 44 may be 15 μm wide and channel 50 may be 5 μm wide while channels 97 may be about 4 mils wide. The channels 97 are sufficiently wide so as not to obstruct the rapid lateral growth from the submesa side walls 51 and 53 during expitaxial growth.

The raised regions 98 protect the channeled mesa 44 from damage during the various stages of processing. For example, the regions 98 protect the fragile mesa 44 from damage during the application of conventional masks to the surface of the substrate 52.

Figure 15:
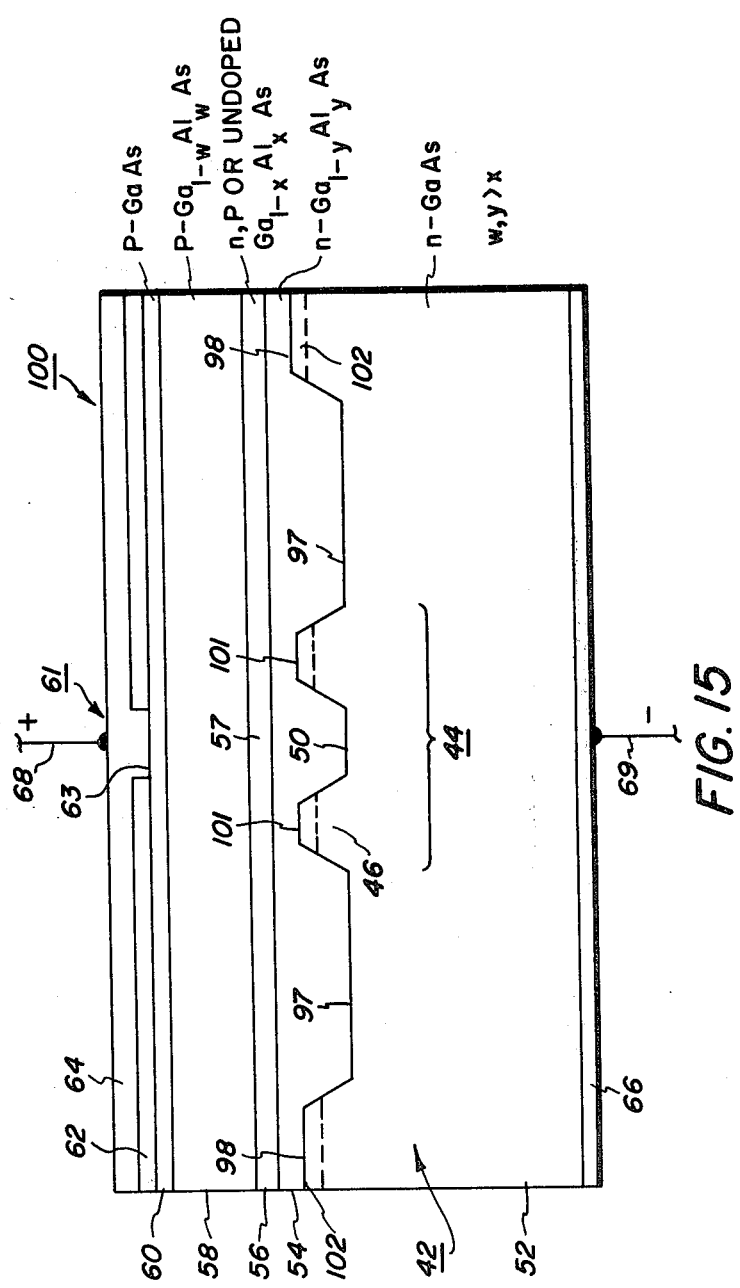
FIG. 15 is a side elevation of a channeled mesa laser similar to that shown in FIG. 14 and having current confinement modifications at the substrate.

Laser 100 in FIG. 15 is substantially identical to laser 96 in FIG. 14, except for the provision of the diffused regions 101 and 102 formed by a uniform zinc diffusion followed by preferential etching of the substrate surface to form the mesa 44 and raised regions 98. Diffused regions 101 provide some current confinement to the channel 50 below the active layer 56.

Figure 16:
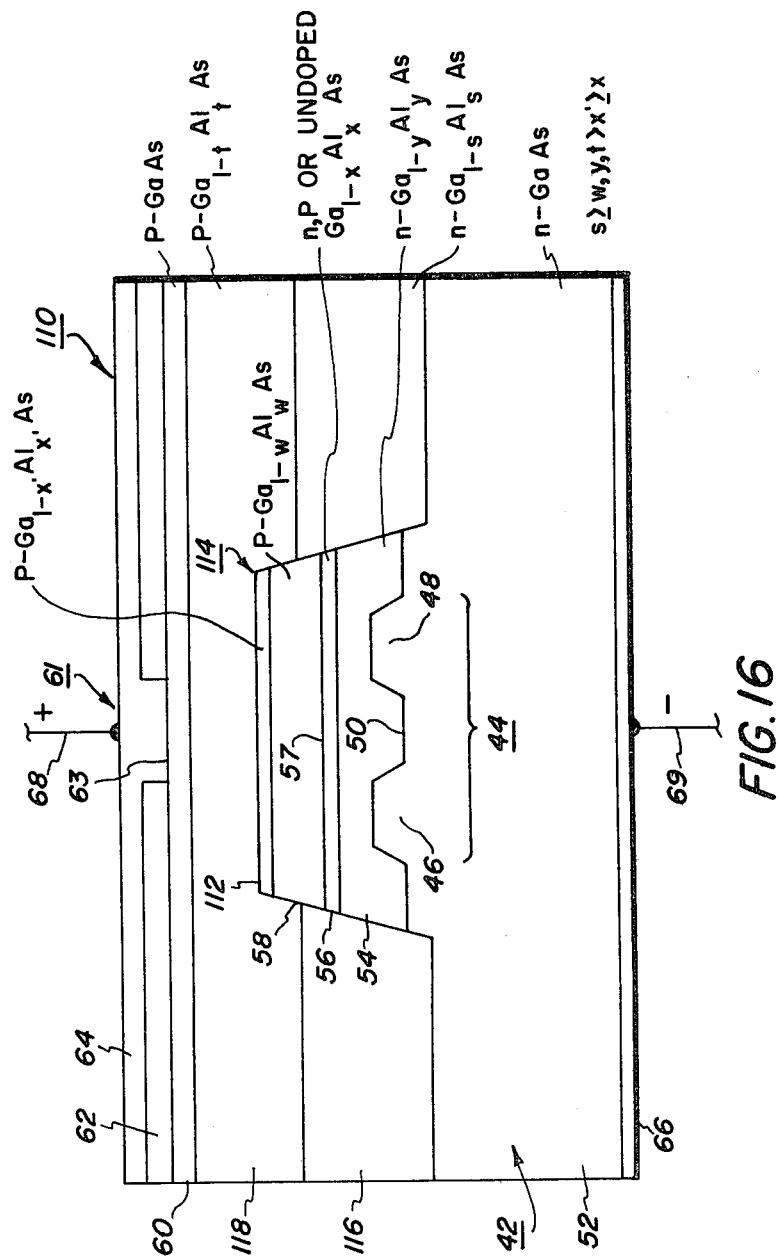
FIG. 16 is a side elevation of a buried channeled mesa laser providing pronounced carrier and current confinement.
Figure 17:
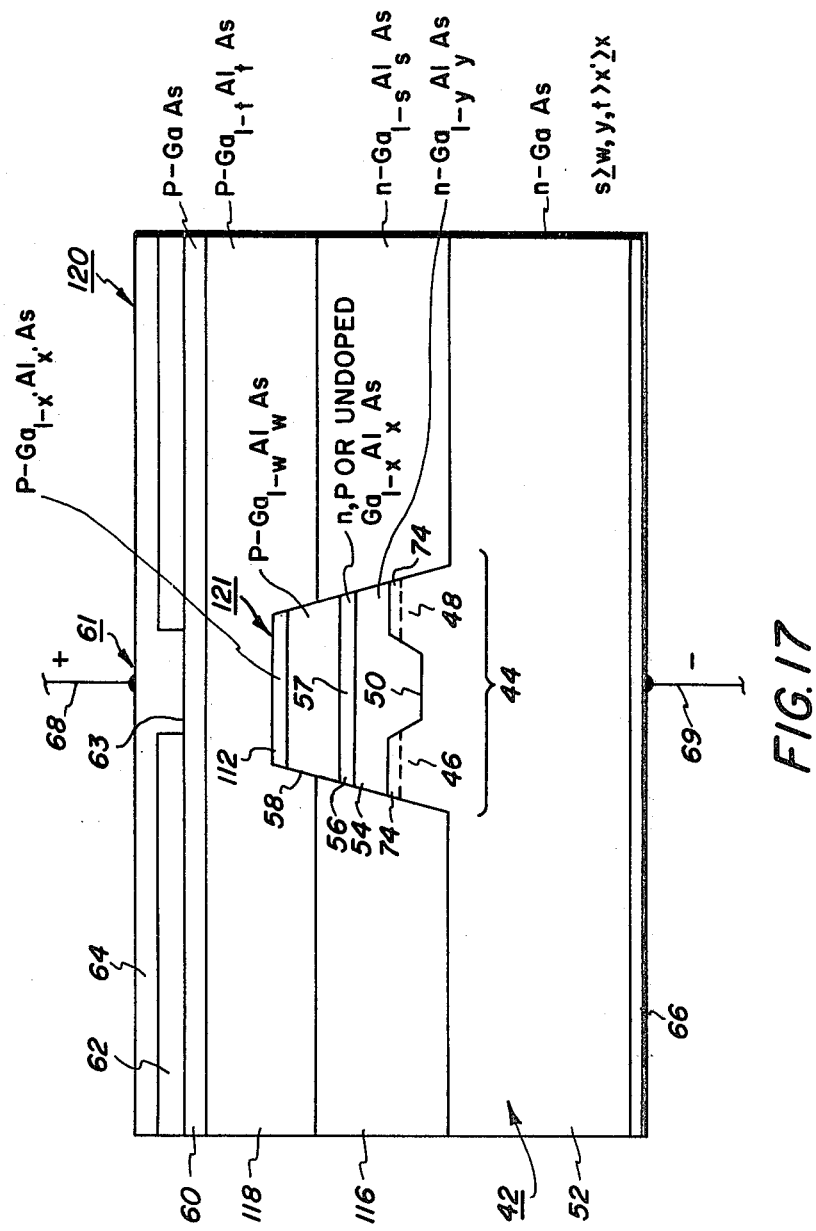
FIG. 17 is a side elevation of a buried channeled mesa laser similar to that shown in FIG. 16 but with further current confinement attributes.
Figure 18:
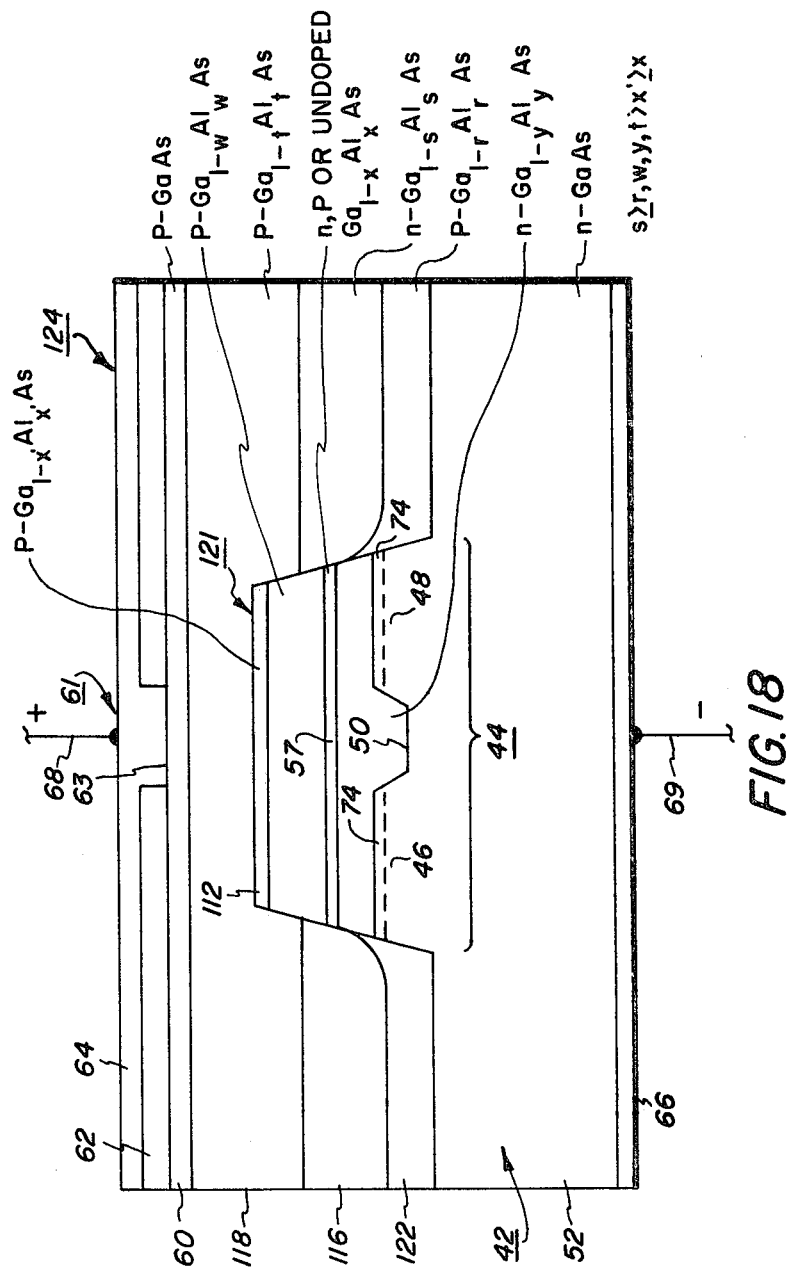
FIG. 18 is a side elevation of a buried channeled mesa laser similar to that shown in FIG. 17 but having a still further current confinement attribute.

The laser structures shown in FIGS. 16 through 18 are buried heterostructure devices requiring two stages of growth. These structures have additional advantages, such as, lower threshold and reduced relaxation oscillations. In FIG. 16 the channeled mesa laser 110 has a central structure comprising the channeled mesa 44 contiguous with the substrate 52 and upon which are sequentially grown the layer 54, the active layer 56, the layer 58 and a capping layer 112. Except for the last mentioned layer, the structure, thus far, is identical to the laser structure shown in FIG. 5. Capping layer 112 is a p-type layer of $Ga_{1-x'}Al_{x'}As$ and contains a low Al content. The Al content may be about as low as the Al content in the active layer 56.

Growth over layer 112 is inhibited until that surface becomes a more favored region for nucleation which will occur in this case when layer 118 nearly reaches or actually grows higher than the surface of the layer 112.

Upon completion of the deposition of the layer 112, first stage epitaxial growth is complete. A preferential etch is then performed, utilizing a mask to form the elongated laser mesa 114.

Second stage growth is then commenced. A layer 116 of $n-Ga_{1-s}Al_sAs$ is epitaxially deposited. The growth of this layer is continued above the horizontal level of the active layer 56. Next, a layer 118 of $p-Ga_{1-t}Al_tAs$ is deposited on the structure. Upon completion of the epitaxial growth layer 118, the depositing of p-GaAs capping layer 60 completes the semiconductor structure.

The mole fractions for s and t of layers 116 and 118 may be in the range of 0.2 to 0.7 (0.3 as a specific example). The purpose of layers 116 and 118 together with layers 54 and 58 is to provide complete carrier confinement to the active layer 56. Current confinement may be provided to the mesa 114 if chromium or oxygen doping of layers 116 and 118 is used to render them semi-insulating.

Laser 120 in FIG. 17 is identical to laser 110 in FIG. 16 except that diffused regions 74 are formed in the channeled mesa 44 in the same manner as described in FIG. 6. Also, the laser mesa 121 is formed to be of narrower width than laser mesa 114 to take advantage of the current confinement offered by the reverse biased junctions formed at the interface between the diffused regions 74 in substrate 52 and layer 54.

Laser 124 in FIG. 18 is essentially identical to the laser 120 in FIG. 17 except that the laser mesa 121 has a larger width and the second stage growth includes an initial epitaxial deposition of a layer 122 comprising $p-Ga_{1-r}Al_rAs$, where r may be in the range of 0.2–0.7 (0.3 as a specific example). The growth of layer 122 should terminate before reaching the horizontal level of the active layer 56, preferably in proximity to the diffused regions 74. The reverse bias junctions provided at the interfaces of layers 122 and 116 and at the interfaces of regions 74 and layer 54 provide for complete current confinement below the active region 57. The current flow is established directly through the mesa channel 50.

Figure 28:
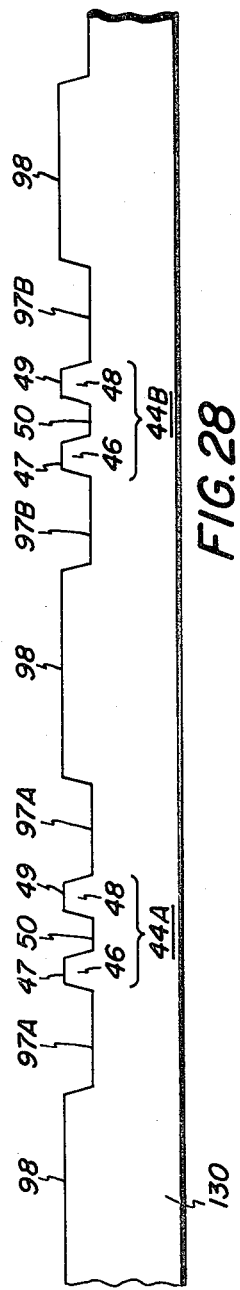
FIG. 28 is the side elevation of a portion of a substrate wafer designed for fabrication of an array of channeled mesa lasers.

As illustrated in FIG. 28, an array of laser structures can be epitaxially formed on the substrate wafer 130. The substrate configuration shown is the same configuration for the laser 96 of FIG. 14. A portion of the wafer 130 is shown after preferential etching and illustrating two channel mesas 44 separated by channels 97a and 97b and raised region 98. The width of each channeled mesa 44 may be 1.5 mils, the width of each of channel 97 may be 4 mils. The width of the raised region 98 may be 10 to 20 mils depending on spacing of lasers in the array.

Figure 28A:
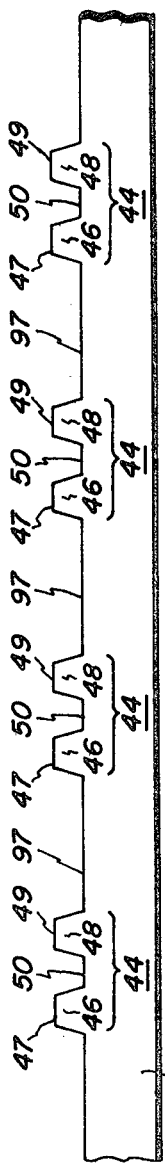
FIG. 28A is the side elevation of a portion of a substrate wafer designed for fabrication of another array of channeled mesa lasers.

In FIG. 28A, raised regions 98 are not present so that greater density of the laser array can be achieved. The substrate 130' is provided with a plurality of channeled mesas 44 separated from one another by the channels 97. The width of the channels 97 should be wider than the width of the channeled mesa 44.

Figure 29:
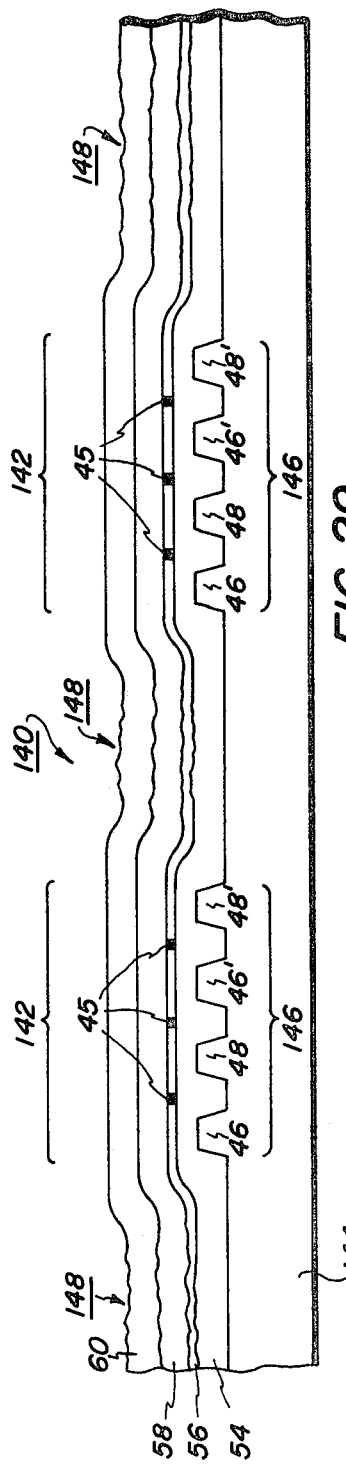
FIG. 29 is the side elevation of groups of channeled mesa laser arrays fabricated on the same substrate wafer.

In FIG. 29, groups 140 a multiple laser arrays 142 are shown fabricated on the same substrate wafer 144. The laser arrays are formed from a multiple channeled mesa 146 contiguous with the wafer surface. The channeled mesas 146 are sufficiently far apart so as to permit smooth faceted surfaces to be formed over the multiple channeled mesas 146 with layer irregularities formed in the outer regions 148. Multiple channeled mesas 146 has to be limited in width in order to ensure smooth facet like growth. Layers 54, 56, 58 and 60 are fabricated of the same materials as previously discussed and are deposited in the same manner as previously explained.

The multiple channeled laser arrays 142 may be separated from one another at the regions 148. Their fabrication is completed by forming stripe contacts 63 over each of the channels 50.

The individual lasers formed in each array 142 are fabricated sufficiently close together so that a portion of the light in each established optical cavity, represented by the emitting apertures 45, is coupled into an adjacent cavity. This provides for a high power collimated beam in the manner disclosed and described in patent application Ser. No. 956,307 filed Oct. 30, 1978, U.S. Pat. No. 4,255,717, entitled, "Monolithic Multi-Emitting Laser Device" and assigned to the same assignee of record.

LARGE OPTICAL CAVITY(LOC)STRUCTURES

Figure 19:
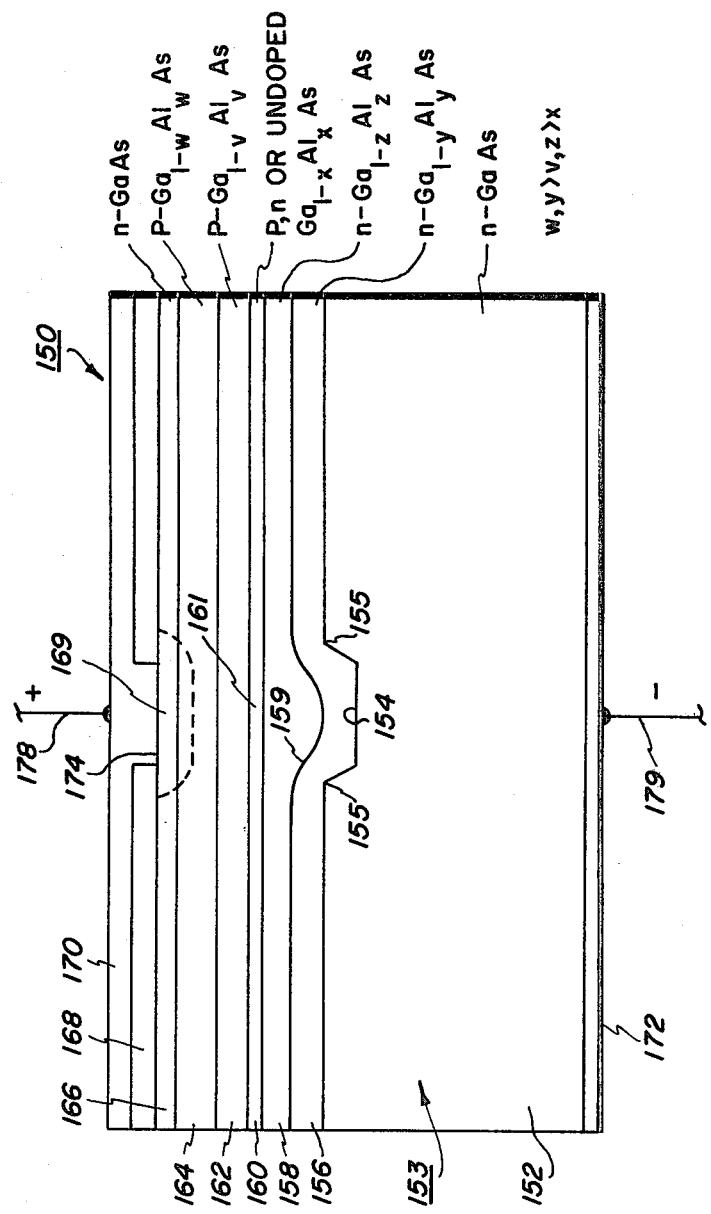
FIG. 19 is a side elevation of a channel substrate nonplanar laser having a large optical cavity (NP-LOC).

CSP lasers, as previously indicated, have proved to be very promising in the market place because they exhibit stable single transverse and single longitudinal mode operation. However, the emitting aperture tends to be fairly asymmetric. This requires the employment of cylindrical lenses in focusing the laser beam to a spot in an optical application rather than employing less expensive spherical lenses. The CSP laser 150 in FIG. 19 is designed to produce a more symmetrical emitting aperture, permitting the use of spherical lens in desired optical applications.

Although the LOC laser 150 and other LOC lasers to be subsequently described are all nonplanar (NP) LOC structures, these structures may be fabricated so that all semiconductor layers are grown in a manner to be planar over the channel or the channeled mesa provided in or on the substrate.

Laser 150 comprises a substrate 152 upon which is an elongated channel 154 formed by preferential etching. Layers 156, 158, 160, 162, 164 and 168 are epitaxially grown on substrate 152. Layer 160 constitutes the active layer. The face 153 is one of the two cleaved facets providing optical feedback. The type of layers and conductivity type for each of these layers is shown in FIG. 19. The range of mole fractions and example of layer thicknesses for these is shown in Table II.

TABLE II

| | d mole fraction | | layer thickness ($\mu$m) |
|---|---|---|---|
| | range | specific example | |
| W | .10–.70 | .30 | .35 |
| V | .10–.35 | .20 | .5 |
| X | 0–.1 | .05 | .1 |
| Z | .10–.35 | .20 | .2* |
| Y | .10–.70 | .30 | .2* |

*outside the channel region

If a laser is desired that emits light in the visible portion of the spectrum, such as, 7500 A to 6500 A, the Al composition for all these layers would be increased accordingly.

Fabrication of laser 150 requires only a single step liquid phase epitaxy (LPE) process at about 700° C. using a 0.4° C./min cooling rate. An example is as follows:

Photolithographically delineated straight channels 2.5–4 $\mu$m wide are preferentially etched along the (01$\bar{1}$) direction into a n-type Si-doped ($2 \times 10^{18}$ cm$^{-3}$) (100)-oriented GaAs substrate 152 using a mixture of 120 ml ethylene glycol, 6.5 ml $H_3PO_3$, 30 ml $H_2O_1$ and 1 ml HF. The depth of the channel 154 is about 3.1 $\mu$m and the channel width is about 7 $\mu$m. The first three layers 156, 158 and 160, which are n-$Ga_{0.65}Al_{0.35}As$ ($5 \times 10^{17}$ cm$^{-3}$) n-$Ga_{0.80}Al_{0.20}As$ ($5 \times 10^{17}$ cm$^{-3}$), and p-$Ga_{0.95}Al_{0.05}As$ ($3 \times 10^{17}$ cm$^{-3}$), are grown by LPE such that the etched channel 154 is only partially filled. Thus, active layer 160 has an active region 161 with a slight dip or convex shape 159 extending toward the substrate 152, similar to the active region 161 of the laser in FIG. 25. Growth of the fourth p-$Ga_{0.80}Al_{0.20}As$ ($5 \times 10^{17}$ cm$^{-3}$) layer 162 completely fills and flattens the growth so that the remaining p-$Ga_{0.08}Al_{0.35}As$ ($10^{18}$ cm$^{-3}$) layer 164 and n-GaAs ($5 \times 10^{17}$ cm$^{-3}$) capping layer 166 are planar. On layer 164, an 8 $\mu$m stripe contact 174 through an oxide or nitride layer 168 is aligned directly above the channel 154 and is produced by a Zn diffusion 169 through the thin 0.3 $\mu$m n-type GaAs capping layer 164 in the same manner as laser 70 in FIG. 6. Ohmic Cr/Au p-type and Sn/Pd/Au n-type metalizations 170 and 172, respectively, are then applied. Terminals 178 and 179 are then soldered to the metalizations 170 and 172 for electrical connection and operation of the laser.

About 60 lasers were so fabricated and mounted for testing. 200 to 300 $\mu$m long lasers with untreated facets were operated at 300 k pulsed laser thresholds (100 nsec pulse width and 1 kHz repetition rate) and ranged from 32 to 60 mA. These lasers were also prescreened for low threshold prior to mounting with about 40% of the lasers on the wafer falling in this range. These low threshold values are believed to be attributed to the optical confinement property of the NP-LOC. Even still lower values can be achieved by employing suitable facet coatings to increase reflectivity.

Several 225 $\mu$m long lasers with an 8 $\mu$m wide p-contact stripe were studied in further detail. Laser thresholds of about 49 mA were common. This corresponds approximately to a current density of 2.72 kA/cm$^2$. The output was free of kinks up to 25 mW/facet at about 135 mA, which is about 2.75 $I_{th}$. The differential quantum efficiency for both facets was about 40%, which is typical for this type of laser.

The near-field pattern demonstrated that the laser filament is stabilized in the center of the NP-LOC and the beam aspect ratio is less than 2.5:1. They exhibited very good lateral mode control with a half-power width of 1.5 μm. Such lateral wave confinement accounts in part for observed low threshold values. Also, the near-field phase fronts are thought to be nearly planar since focusing with a spherical lens indicates that the wave centers coincide axially with 2 μm.

This NP-LOC laser structure also shows stable near and far field patterns to have high output optical powers of about 25 mW/facet with lateral and transverse beam divergences of approximately 16° and 27°, respectively. Even at high power, the NP-LOC output beam is stable with the added advantage of reducing optical facet damage due to the spreading out of the optical wave into the large optical cavity so that there is less light density per unit area.

The improved feature of laser 150 over prior CSP lasers, such as disclosed in FIGS. 1 and 2, is the utilization of the optical waveguide layers 158 and 162 to obtain lateral light wave guidance independent of the injected charges at the active region. Layer 158 is non-planar and allows the propagating beam to spread out in the vertical plane. This provides for a more symmetric emitting aperture. The electron and hole carriers are confined to the active region 161 of the active layer 160 because the established potential barrier between the active region 161 and the adjacent layers 158 and 162 is sufficient to confine them to this region.

Also, transverse modes on either side of the channel 50 will have considerably higher thresholds. The lowest order transverse modes, either perpendicular or parallel to the p-n junction plane, exist only directly above the channel 154.

Optical wave guidance is established within the NP-LOC formed across active region 161 within the confines of layers 158 and 162. The thickest cross section of layer 158 is at the central point of region 159 which will, therefore, be the highest effective index of refraction in this layer. Because of the "focusing" action of the NP-LOC, the transverse modes of the propagating light wave are well confined in the horizontal and vertical planes to the center of the active region 161. Stability of the lowest order mode may be further achieved by designing the NP-LOC structure to have radiation loss at the sides of the central channel as in the case of prior art CSP lasers. However, the inclusion of such radiation loss via the GaAs substrate is not essential to the lowest order mode operation of the NP-LOC laser because of the focusing action of the NP-LOC.

A grading of composition transversely of layers 158 and 162 to provide a gradual change in the refractive index of these layers extending from the active region 161 would further improve the waveguiding properties of laser 150. The cross-sectional compositional content of the Al molar fraction can be varied in linear or non-linear manner to provide a continuous index change. This composition grading can be also employed in NP-LOC laser structures to be subsequently described.

Also, mole fraction for layers 158 and 162 need not be identical. For example, the mole fraction, z, for layer 158 may be 1% different from the mole fraction, v, for layer 162. The mole fraction and thickness of these layers as well as the extent of curvature at their central regions can be controlled to produce the desired contour for the NP-LOC and provide a specifically desired emitting aperture.

Figure 20:
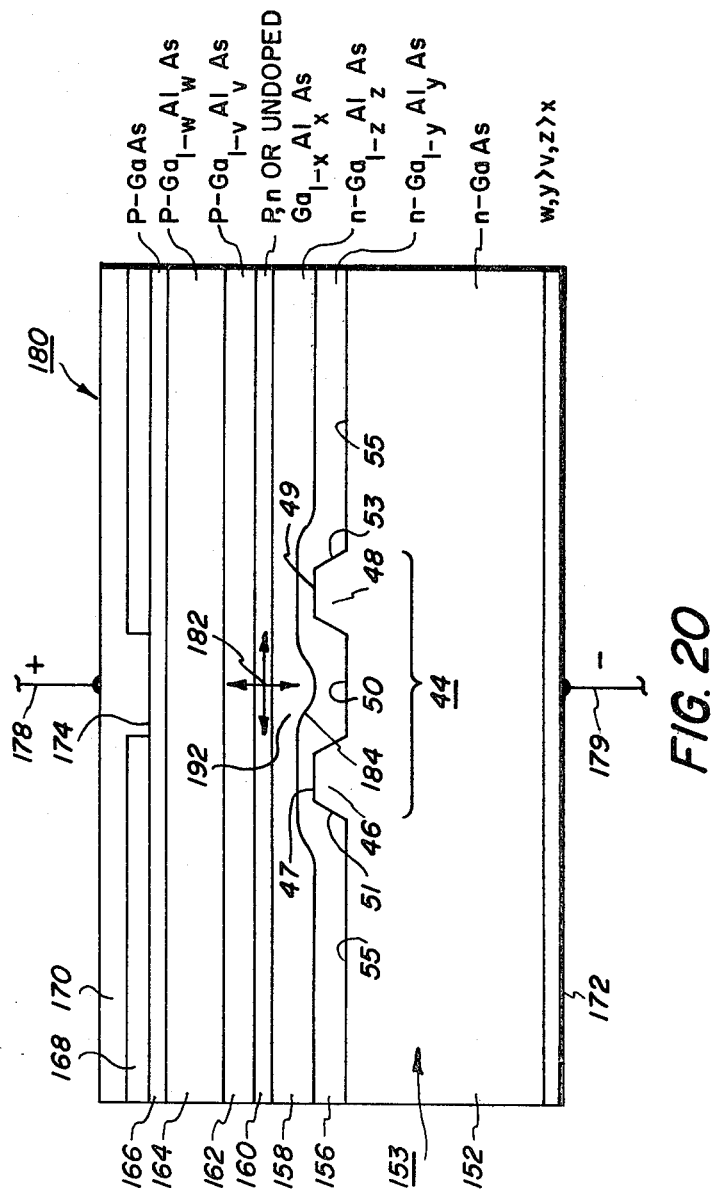
FIG. 20 is a side elevation of a channeled mesa nonplanar laser laser having a large optical cavity (NP-LOC).

The laser 150 reliably demonstrates that they are quite reproducible with respect to threshold, quantum efficiency and power verses current linearity. Their reproducibility and ultimate yields can be further improved by the incorporation of the channeled mesa 44 as shown in FIG. 20. Non-planar channeled mesa laser 180 is provided with the channeled mesa 44 contiguous with the surface of the substrate 152. Controlled growth of the layers 156, 158, 160, 162 and 164 provides for the non-planar large optical cavity 182 with layer 156 having a formed dip or curved portion 184 defining an enlarged portion 192 in layer 158. The layers contained within the NP-LOC 182 have the smooth faceted surfaces, as previously explained in detail relative to the channeled mesa lasers of prior figures.

Figure 21:
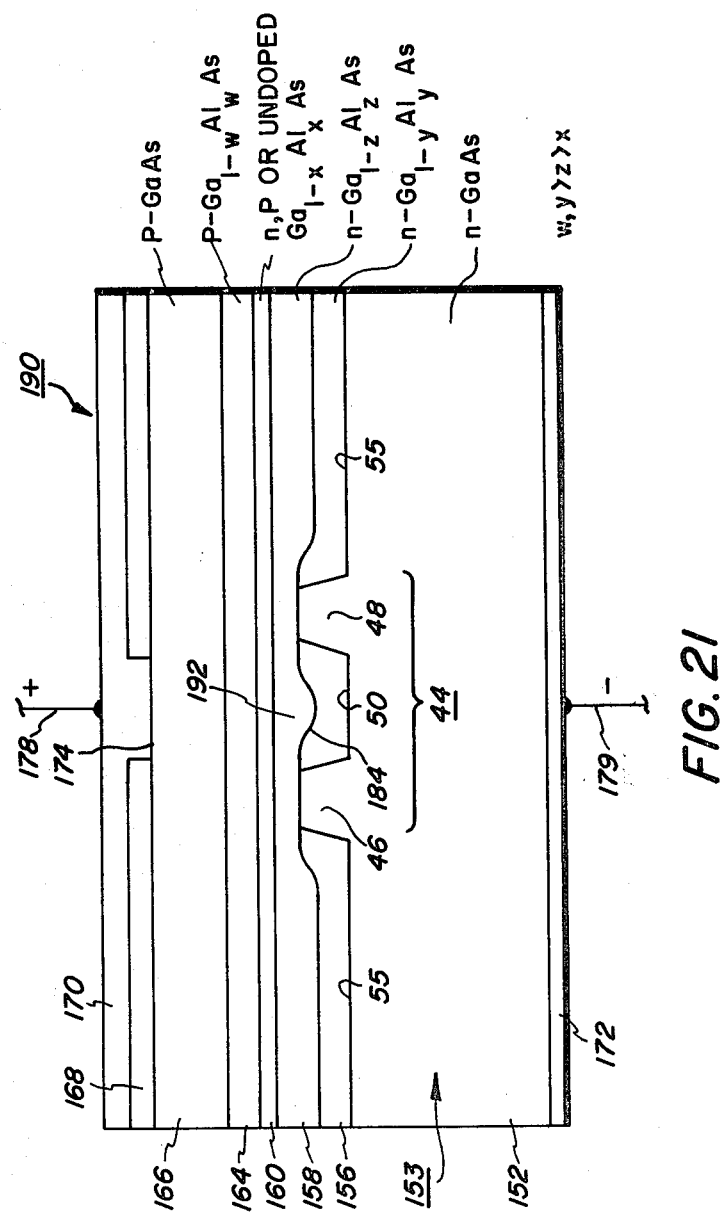
FIG. 21 is a side elevation of a channeled mesa NP-LOC laser similar to that shown in FIG. 20 except the enlarged optical cavity is provided only on one side of the active layer.
Figure 22:
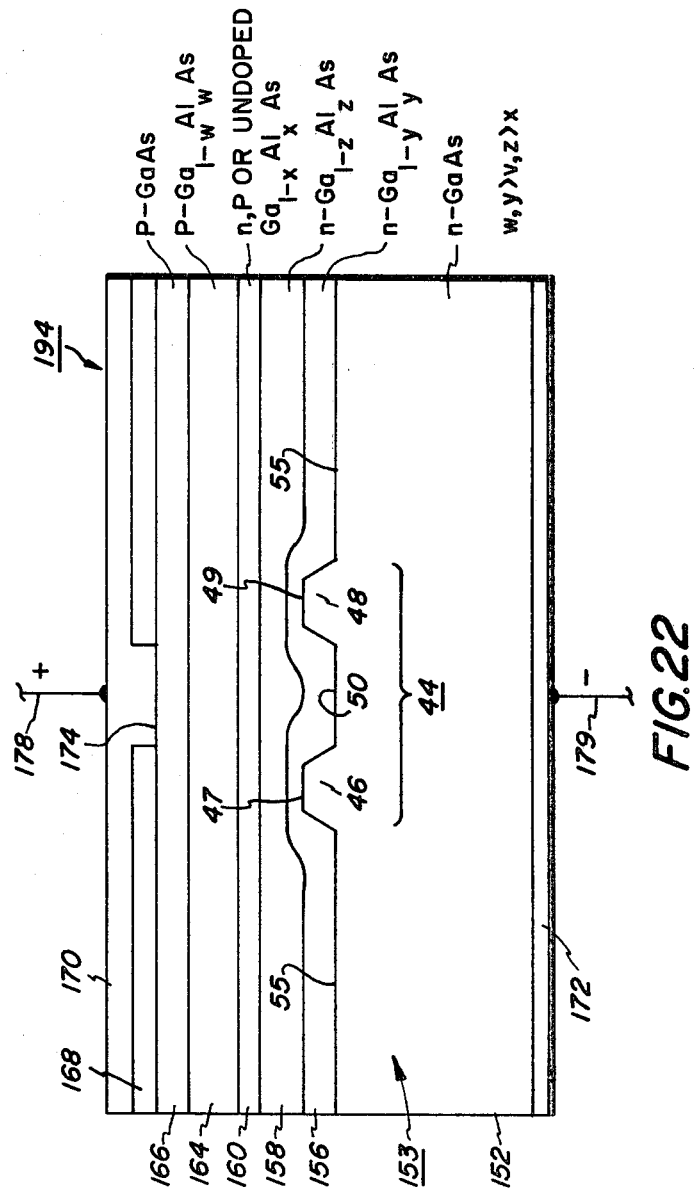
FIG. 22 is a side elevation of a channeled mesa NP-LOC laser similar to that shown in FIG. 21 except for a variation in deposited layer thicknesses.

NP-LOC lasers 190 and 194 in FIGS. 21 and 22 differ from laser 180 in that waveguide layer 162 is not employed in the fabrication of these devices. The elimination of layer 162 has the advantage of possibly providing a lower threshold and may improve the stablization of the transverse mode. This is because a larger portion of the propagating light will be in the enlarged portion 192 of layer 158 as compared to the same position in the structure of the laser 180. However, the trade off is a greater beam divergence at the emitting aperture.

The significant difference between the structure of NP-LOC laser 190 and NP-LOC laser 194 is the amount of growth or deposited thickness of layer 156. In FIG. 21, growth of layer 156 terminates with the deposition and channel filling in reaching the level of the submesa surfaces 47 and 49. In FIG. 22, the growth of layer 156 is continued above these surfaces. These differences represent controlled differences in the amount of the absorbtion of light or electron hole loss into the GaAS substrate 152. The configuration in FIG. 22 provides an increase in light absorbtion and possibly enhanced transverse mode stability but at the expense of increased current threshold.

Figure 23:
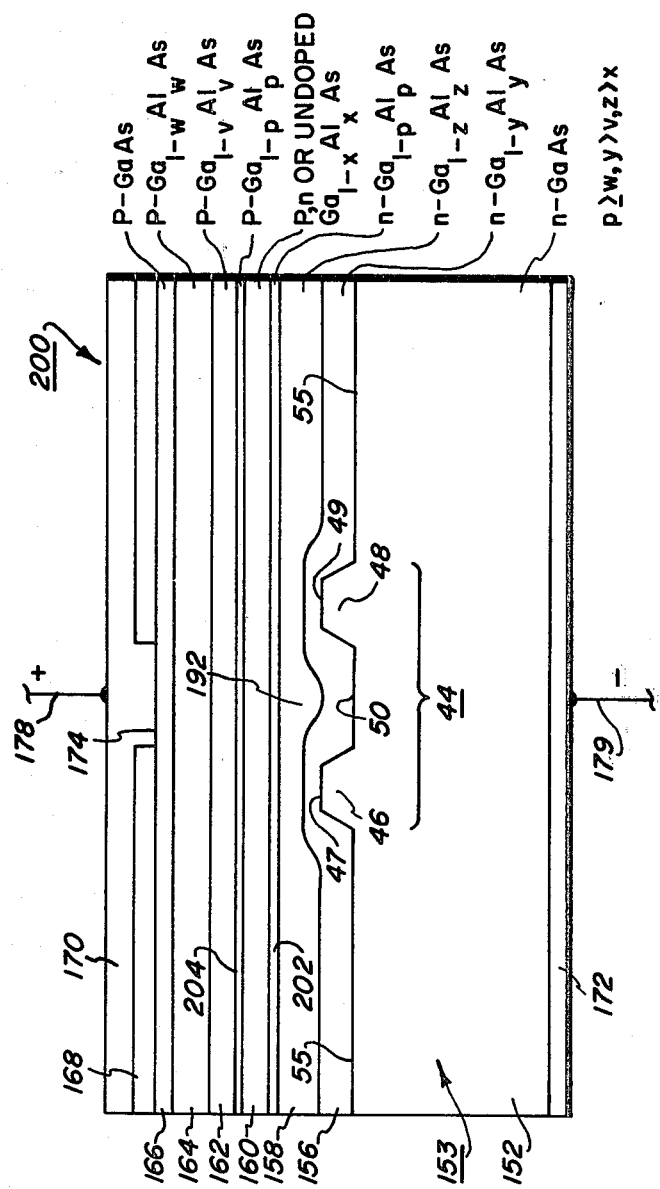
FIG. 23 is a side elevation of a channeled mesa NP-LOC laser similar to that shown in FIG. 20 but, in addition, having very thin cladding layers adjacent the active layer thereof.

NP-LOC laser 200 in FIG. 23 is quite similar to NP-LOC laser 180 in FIG. 20, except for the addition of the high Al content layers 202 and 204 disposed on adjacent sides of the active layer 160. These layers have a higher Al content than layers 158 and 162. Layers 202 and 204 may each have a thickness of 0.005–0.1 μm while the other layers 156–164 may have the exemplified thicknesses set forth in Table II. Layers 202 and 204 provide a high barrier to carrier confinement. Upon forward biasing with a potential applied across electrodes 178 and 179, carriers are injected into and confined within the active layer 160 by the thin cladding layers 202 and 204. Upon carrier recombination, the optical radiation produced has a wide profile, as in the case of other NP-LOC lasers disclosed herein, the wave spreading out into the waveguiding layers 158 and 162. The basic fundamentals in employing thin cladding layers adjacent to the active layer is disclosed in patent application Ser. No. 003,312 filed Jan. 15, 1979, entitled "High Output Power Laser" and assigned to the same assignee of record.

Figure 24:
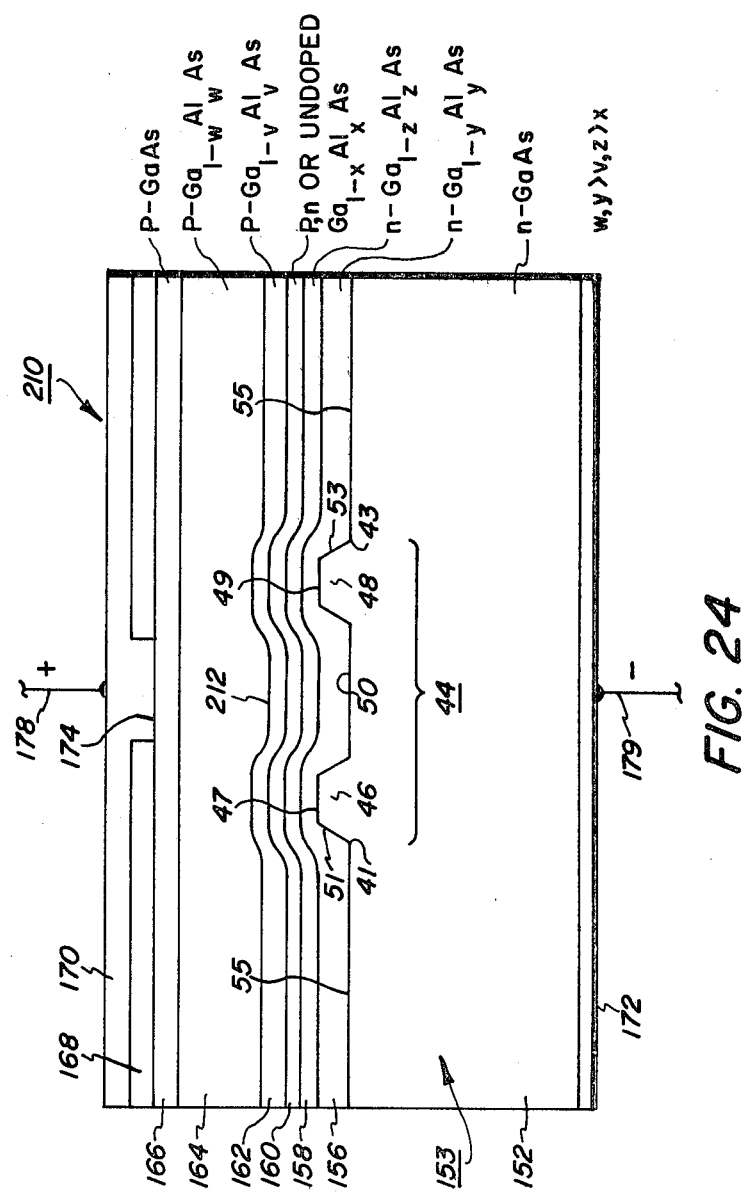
FIG. 24 is a side elevation of a channeled mesa NP-LOC laser designed to have all nonplanar layers.

In FIG. 24, NP-LOC laser 210 is provided with a channeled mesa 44 having a wide channel 50 between the submesas 46 and 48. Growth of layers 156 through 164 may be controlled to be all non-planar at area 212. This may aid in stabilizing the operation and filament of the laser since the thickest width of all three layers 158, 160 and 162 is above the center of the channel 50.

Figure 25:
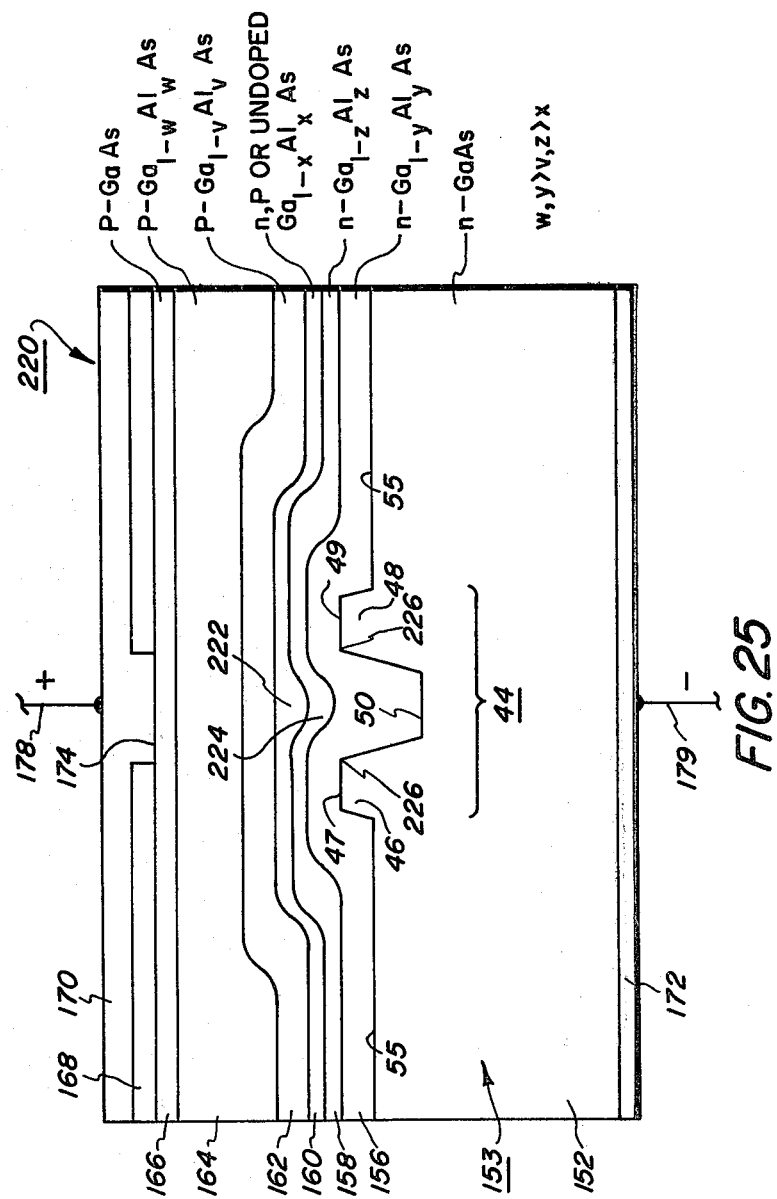
FIG. 25 is a side elevation of a channeled mesa NP-LOC laser designed to have a nonplanar active layer.

NP-LOC laser 220 in FIG. 25 is provided with a modified channeled mesa 44 shown in FIG. 9. Growth of the layers, 156, 158, and 160 over the deep channel 50 can be controlled so that the active layer 160 is the last non-planar layer before the completion of flat crystal growth over mesa 44. The provision of a larger active region cavity 222 will provide for filament stabilization. This NP-LOC structure will permit spreading of the propagating light wave into layers 158 and 162 including cavity 224. Cavity 224 in layer 158 provides mode stability because of its higher index in its center region. Additional mode control may be achieved by growing layer 156 thin enough over the channeled mesa 44 so that light absorbtion occurs into the GaAs substrate 152.

Figure 26:
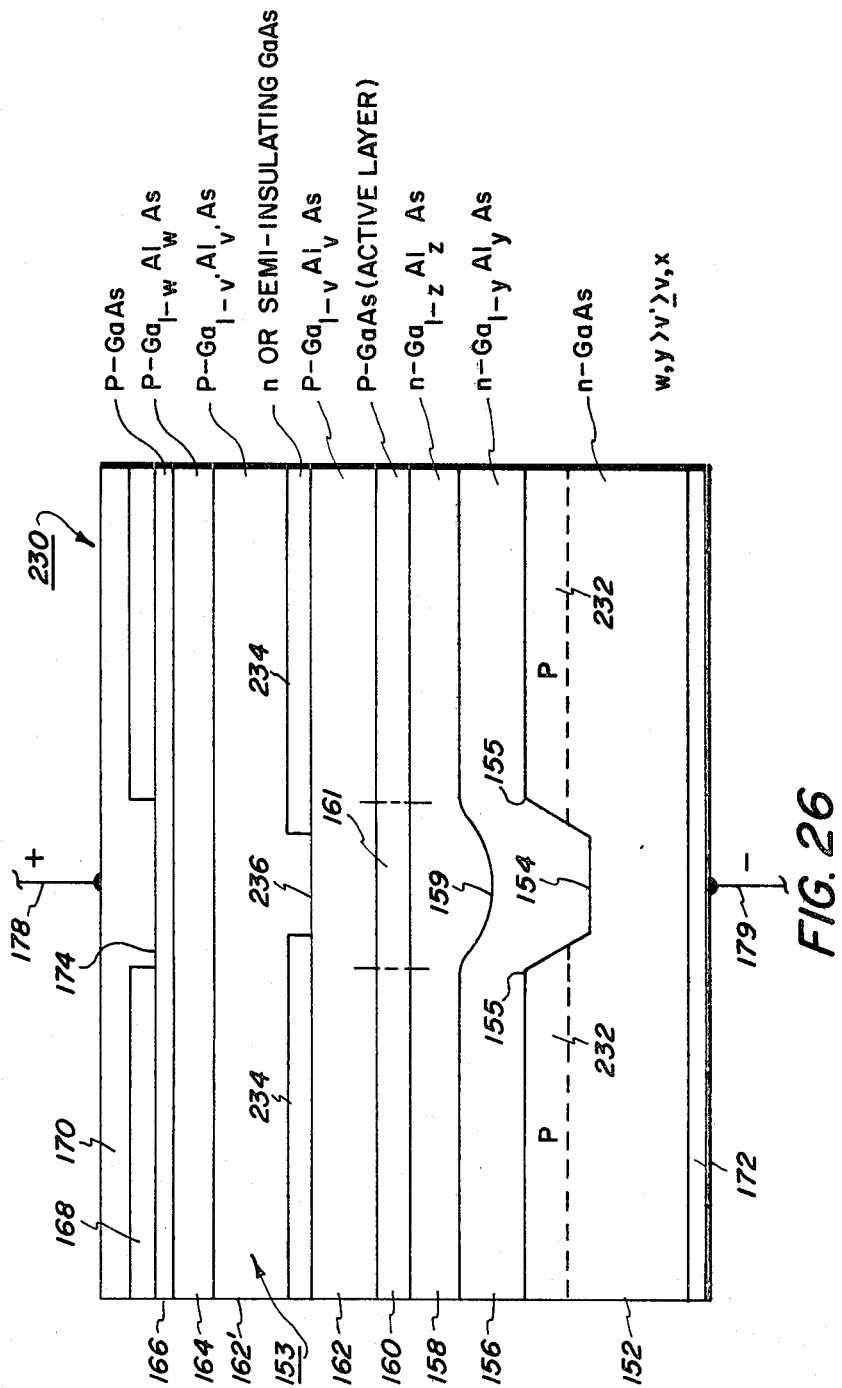
FIG. 26 is a side elevation of a channeled mesa NP-LOC laser with optical cavity confinement on adjacent sides of the active layer of the device.
Figure 27:
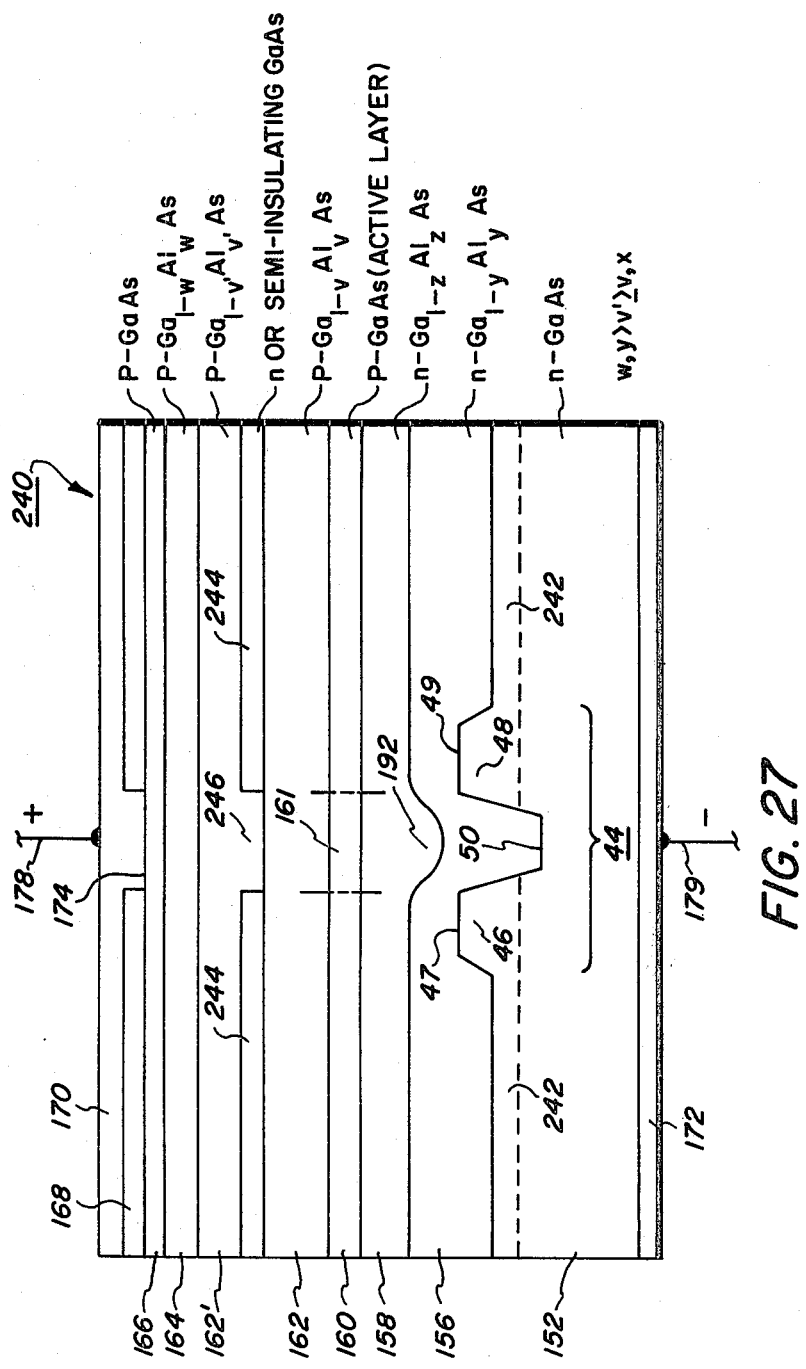
FIG. 27 is a side elevation of a channeled mesa NP-LOC laser similar to that shown in FIG. 26 but with a different substrate design.

The NP-LOC lasers 230 and 240 in FIGS. 26 and 27 differ from previous NP-LOC embodiments by incorporating, respectively, a zinc diffused region 232 and 242 in their substrates 152 and the provision of a semi-insulating layer 234 and 244 forming an elongated current channel 236 and 246, respectively, through these layers. The diffused regions 232 and 242 provide for current confinement through channels 154 and 50, respectively. Channels 236 and 246 confine current to an area through these channels and through active region 161.

Layers 162 and 162' may be p-Ga$_{1-v}$Al$_v$As where v=v'. Layer 162 may also be fabricated to have a slightly higher index of refraction so that v' v. As an example, v may be 0.15 and v' may be 0.17.

The epitaxial fabrication of the lasers 230 and 240 is the same as previously explained relative to the laser 150.

Upon termination of the growth of layer 162, the GaAs layers 234 and 236, doped with chromium or oxygen for semi-insulating properties, is epitaxially deposited. Upon completion of this deposition, a preferential etching is made to form the respective channels 236 and 246. Then, crystal growth is continued with the sequential deposition of layers 162', 164 and 166.

In FIG. 27, a deep channel configuration is provided for channeled mesa 44 of the laser 240 so that, after zinc diffusion of the substrate 152 to form region 242, the preferential etching of channel 50 will extend through the diffused region 242 into the n-type substrate.

While the invention has been described in conjunction with specific embodiments, it is evident that many alternatives, modifications and variations will be apparent to those skilled in the art in light of the foregoing description. Accordingly, it is intended to embrace all such alternatives, modifications, and variations as fall within the spirit and scope of the appended claims.

What is claimed is:

1. In a heterostructure semiconductor laser comprising a plurality of contiguous layers of semiconductor material on the top surface of a semiconductor substrate, one of said layers forming an active layer for light wave propagation under lasing conditions, said laser characterized by a channeled mesa contiguous with the top surface of said substrate, said channeled mesa comprising an elongated mesa with an elongated channel formed in the top surface of said mesa whereby during crystal growth of said semiconductor layers, said active layer and the semiconductor layers contiguous therewith over said channeled mesa are caused to grow uniformly with smooth facet like finishes and without layer surface irregularities.

2. In the heterostructure semiconductor laser of claim 1 wherein said channel forms said channeled mesa into two submesas having submesa plateaus, the channel width to submesa plateau width ratio established to provide minimum amount of deposit on said submesa plateaus during crystal growth while providing more rapid growth in said channel and top surfaces of said substrate adjacent to said channeled mesa.

3. In the heterostructure semiconductor laser of claim 2 wherein the preferred ratio of submesa plateau width to channel width is about 2:1 to 5:1.

4. In the heterostructure semiconductor laser of claim 1 wherein said channeled mesa comprises two submesas separated by said channel, each submesa having a triangular cross-sectional configuration.

5. In the heterostructure semiconductor laser of claim 1 wherein said channeled mesa comprises two submesas separated by said channel, each submesa having a dovetail cross-sectional configuration.

6. In the heterostructure semiconductor laser of claim 1 wherein said channel is at a depth below the surface of said substrate.

7. In the heterostructure semiconductor laser of claim 1 wherein said channel is at a depth above the surface of said substrate.

8. In the heterostructure semiconductor laser of claim 1 wherein said active layer is fabricated to be nonplanar in the region thereof directly above said channel.

9. In the heterostructure semiconductor laser of claim 1 wherein said channeled mesa comprises two submesas separated by said channel, each of said submesas having a plateau, said active layer is fabricated to have its crystal growth terminate on the surface of said plateaus.

10. In the heterostructure semiconductor laser of claim 9 wherein the top surfaces of said plateaus have deposited thereon semiconductor material layers that tend to minimize subsequent crystal growth on the surface thereof.

11. In the heterostructure semiconductor laser of claim 10 wherein said layers are semi-insulating to provide current confinement properties in said laser.

12. In the heterostructure semiconductor laser of claim 1 wherein said channeled mesa comprises two submesas separated by said channel, each of said submesas having a plateau, a pair of elongated channels in said substrate and substantially parallel with said channeled mesa channel but adjacent to and outside of said channeled mesa, the width of said outside channels being larger than said channeled mesa channel.

13. In the heterostructure semiconductor laser of claim 12 wherein the plateaus of said submesas are substantially in the same plane as the surface of said substrate.

14. In the heterostructure semiconductor laser of claim 12 wherein current confinement means are provided at the surfaces of said submesa plateaus to aid in channeling current through said channeled mesa channel during operation of said laser.

15. In the heterostructure semiconductor laser of claim 14 wherein said current confinement means comprises a diffused region formed into said plateaus of opposite conductivity type to the semiconductor material within said channeled mesa channel.

16. In the heterostructure semiconductor laser of claim 1 wherein said channel forms said channeled mesa into two submesas having submesa plateaus, current confinement means provided at the surfaces of said submesa plateaus to aid in channeling current through said channeled mesa channel during operation of said laser.

17. In the heterostructure semiconductor laser of claim 1 wherein said channel forms said channeled mesa into two submesas having submesa plateaus, said contiguous layers forming said laser having a dimensional width greater than the dimensional width of said channeled mesa and forming a larger mesa configuration on said substrate encompassing said channeled mesa, semiconductor material deposited around said larger mesa configuration and having a lower refractive index than said active layer and the immediately adjacent layers to said active layer, said larger mesa configuration forming a buried heterostructure.

18. In the heterostructure semiconductor laser of claim 17 wherein said deposited semiconductor material is semi-insulating to provide current confinement properties to said buried heterostructure.

19. In the heterostructure semiconductor laser of claim 1 wherein said channel forms said channeled mesa into two submesas having submesa plateaus, said contiguous layers forming said laser having a dimensional width substantially the same as the dimensional width of said channel mesa forming a larger mesa configuration on said substrate encompassing said channel mesa, the surfaces of said submesa plateaus extend to the outer edges of said larger mesa configuration, semiconductor material deposited around said larger mesa configuration and having a lower refractive index than said active layer and the immediately adjacent layers to said active layer, said larger mesa configuration forming a buried heterostructure.

20. In the heterostructure semiconductor laser of claim 19 wherein said deposited semiconductor material is semi-insulating to provide current confinement properties to said buried heterostructure.

21. In the heterostructure semiconductor laser of claim 20 wherein current confinement means are provided at the surfaces of said submesa plateaus to aid in channeling current through said channeled mesa channel during operation of said laser.

22. In the heterostructure semiconductor laser of claim 21 wherein said current confinement means comprises a diffused region formed into said plateau surfaces of opposite conductivity type to the semiconductor material within said channeled mesa channel.

23. In the heterostructure semiconductor of claim 1 wherein a plurality of channeled mesas are formed on said substrate, each separated from the other by a channel of the same geometric dimensions as said channeled mesa channel.

24. In the heterostructure semiconductor laser of claim 1 wherein said active layer is sandwiched by two first layers each of semiconductor material having a higher bandgap and a lower index of refraction than said active layer, said first layers being sandwiched by two second layers each of semiconductive material having a higher bandgap and a lower index of refraction than said first layers, said first layers providing carrier confinement to said active layer and said second layers providing optical confinement to the confines of said first layers, the presence of said channeled mesa on said substrate causing a nonplanar condition in a region of one of said first layers in closest proximity to said substrate above said channeled mesa channel during crystal growth, said region being of greater thickness than adjacent regions of said one first layer whereby the geometric shape of said optical confinement produces a more symmetric light emitting aperture from said laser.

25. In the heterostructure semiconductor laser of claim 24 wherein said active layer is also nonplanar in a region above said one first layer region forming an enlarged cavity within said active layer at said active layer region.

26. In the heterostructure semiconductor laser of claim 24 wherein optical confinement means is provided at the interface region of said first and second layers furthest away from said substrate and above said channeled mesa channel.

27. In the heterostructure semiconductor laser of claim 26 wherein optical confinement means also provides current confinement to regions of said laser above said channeled mesa channel.

28. In the heterostructure semiconductor laser of claim 27 wherein current confinement means are provided in said substrate adjacent both sides of said channeled mesa channel.

29. In the heterostructure semiconductor laser of claim 1 wherein said active layer is sandwiched by two first layers each of semiconductor material having a higher bandgap and a lower index of refraction than said active layer, said first layer in closer relation to said substrate being separated therefrom by another layer of semiconductive material having a higher bandgap and a lower index of refraction than said first layers, said first layers providing carrier confinement to said active layer and said another layer providing optical confinement to the confines of said first layers, the presence of said channeled mesa on said substrate causing a nonplanar condition in a region of said another layer above said channeled mesa channel during crystal growth, said region being of greater thickness than adjacent regions of said first layers whereby the geometric shape of said optical confinement produces a more symmetric light emitting aperture from said laser.

30. In the heterostructure semiconductor laser of claim 29 wherein said active layer is also nonplanar in a region above said another layer region forming an enlarged cavity within said active layer at said active layer region.

31. In the heterostructure semiconductor laser of claim 1 wherein current confinement means are provided in the surface of said substrate, the depth of said channel extends into said substrate beyond the depth of said current confinement means to provide a current path through said channel during operation of said laser.

32. In a heterostructure semiconductor laser comprising a plurality of contiguous layers of semiconductor material on the top surface of a semiconductor substrate, one of said layers forming an active layer for light wave propagation under lasing conditions, said active layer being sandwiched by two first layers each of semiconductor material having a higher bandgap and a lower index of refraction than said active layer, said first layers being sandwiched by two second layers each of semiconductor material having a higher bandgap and a lower index of refraction than said first layers, said first layers providing carrier confinement to said active layer and said second layers providing optical confinement to the confines of said first layers, elongated channel means contiguous with said substrate to cause a nonplanar condition in a region of one of said first layers in close proximity to said substrate during crystal growth, said region being of greater thickness than adjacent regions of said one first layer whereby the geometric shape of said optical confinement produces a more symmetric light emitting aperture from said laser.

33. In the heterostructure semiconductor laser of claim 32 wherein optical confinement means is provided at the interface region of said first and second layers furthest away from said substrate and above said channel means.

34. In the heterostructure semiconductor laser of claim 33 wherein optical confinement means also provides current confinement to regions of said laser above said channel means.

35. In the heterostructure semiconductor laser of claim 34 wherein current confinement means are provided in said substrate adjacent both sides of said channel means.

36. In the heterostructure semiconductor laser of claims 32, 33, 34 or 35 wherein said channel means comprises an elongated channel in said substrate.

37. In the heterostructure semiconductor laser of claims 32, 33, 34 or 35 wherein said channel means comprises a channeled mesa contiguous with the top surface of said substrate, said channeled mesa comprising an elongated mesa with an elongated channel formed in the top surface of said mesa.

38. In the heterostructure semiconductor laser comprising a plurality of contiguous layers of semiconductor material deposited on a semiconductor substrate, one of said layers formed to be an active layer for light wave propagation under lasing conditions, said laser characterized by a channeled mesa on the surface of said substrate upon and over which said contiguous layers are epitaxially deposited and comprising an elongated mesa having an elongated channel formed in the top surface of said mesa.

39. In the heterostructure semiconductor laser of claim 38 wherein there is a cladding layer contiguous with each surface of said active layer and each having a higher bandgap and a lower refractive index than said active layer, and means in said cladding layers to produce a quantitative difference in their relative refractive indices.

40. In the heterostructure semiconductor laser of claim 39 wherein said means comprises a compositional difference in the semiconductor material comprising said cladding layers.

41. In the heterostructure semiconductor laser of claim 40 wherein said compositional difference is the percentage of aluminum in the semiconductor materal of gallium aluminum aresnide.

\* \* \* \* \*